United States Patent [19]
Ohmi

[11] Patent Number: 5,432,732
[45] Date of Patent: Jul. 11, 1995

[54] DYNAMIC SEMICONDUCTOR MEMORY

[76] Inventor: Tadahiro Ohmi, 1-17-301. Komegabukuro. 2-chome, Aoba-ku, Sendai-shi, Miyagi-ken, Japan

[21] Appl. No.: 81,375
[22] PCT Filed: Dec. 27, 1991
[86] PCT No.: PCT/JP91/01798
§ 371 Date: Jul. 1, 1993
§ 102(e) Date: Oct. 13, 1993
[87] PCT Pub. No.: WO92/12538
PCT Pub. Date: Jul. 23, 1992

[30] Foreign Application Priority Data
Jan. 1, 1991 [JP] Japan .................. 3-010007

[51] Int. Cl.⁶ .................... H01L 27/10; G11C 11/34
[52] U.S. Cl. ..................... 365/149; 437/43; 437/47; 437/52; 257/301; 257/304; 257/310; 257/311; 257/296

[58] Field of Search ............ 437/43, 47, 52, 60, 437/190, 191, 192, 193, 223, 228; 365/149; 257/301, 304, 310, 311, 296

[56] References Cited
U.S. PATENT DOCUMENTS
5,057,447 10/1991 Paterson ................. 437/43

Primary Examiner—Viet Q. Nguyen
Attorney, Agent, or Firm—Young & Thompson

[57] ABSTRACT

A DRAM memory cell which can be easily manufactured, and has a high breakdown voltage, and a large capacitance. The dynamic semiconductor memory has capacitors for accumulating signal charges, each capacitor comprising three layers: a first electrode which is formed with a thin film of an alloy made of two or more kinds of metallic elements, an insulation thin film made of the oxide of the alloy, and a second electrode formed with a metal.

3 Claims, 18 Drawing Sheets

DYNAMIC SEMICONDUCTOR MEMORY

FIELD OF THE INVENTION

The present invention relates to a semiconductor memory of dynamic type.

DESCRIPTION OF THE RELATED ART

Presently, DRAMs having various structures are known; they can be roughly divided into stacked capacitor types, trench capacitor types, fin types, and the like. The equivalent circuit which is used in all types is shown in FIG. 26; herein, capacitor 40 comprises an insulation film placed between two electrodes 41 and 42, and switch 43 comprises an MOS transistor.

The accumulation charge Q in capacitor 40 is expressed by the following formula.

$$Q = CV_{dd} \ldots \quad (1)$$

wherein
C: capacitance
$V_{dd}$: voltage

Furthermore, C is expressed by means of the following formula.

$$C = S\epsilon_r\epsilon_0/d \ldots \quad (2)$$

Herein,
S: opposing surface area
$\epsilon_r$: relative dielectric constant
$\epsilon_0$: dielectric constant of the insulating film, and
d: insulation film thickness In the case In which a leak of a more or less fixed size is present in the packaged memory, if such a leak having a fixed size is permitted, it is preferable that accumulation charge Q be as large as possible. In order to increase the size of accumulated charge Q, as is clear from formulas (1) and (2), the size of dielectric constant $\epsilon_0$ may be enlarged, the opposing surface area S may be increased, or the insulation film thickness d may be reduced. However, the recent increase in the density of DRAMs has been striking, entering the submicron realm. When such an increase in density is carried out, the value of the opposing surface area S is reduced, and when the value of S is reduced, as can be seen from the above formulas, the capacitance C is also reduced. As a result, progress has been slow in methods of increasing the value of C by increasing the value of $\epsilon_0$ or of S.

However, an increase in the dielectric constant would appear from formulas (1) and (2) to lead to an increase in the accumulation charge Q; however, materials having a large dielectric constant $\epsilon_0$ have poor insulating properties, and as a result, the likelihood of charge leaks increases. Accordingly, in order to increase the accumulation charge Q, it is not sufficient to merely increase the value of C by increasing the value of $\epsilon_0$ or the value of S, but rather, the insulating characteristics must be improved from the point of view of the materials used and of the structure employed.

Here, to consider the conventional technology, improvements to the DRAMs having the structures described above have been attempted in order to maintain the capacitance C at a level above a specified value (40 fF or more). The trench capacitance type has the structure shown in FIG. 27, the fin type has the structure shown in FIG. 28, and the stacked capacitor type has the structure shown in FIG. 29.

In the trench capacitor type, an attempt is made to increase the opposing surface area S, and thus the capacitance, by filling a groove with an insulation film 23 and a metal film 12.

However, when the groove in a trench capacitor type becomes deep, and the aspect ratio thereof reaches a level of 20-30, the cleaning of the interior of the groove becomes difficult, and film deposition may be conducted on the contaminated surface. Furthermore, insulation breakdown occurs easily in the corner areas of the groove, so that the reliability and yield thereof are extremely poor.

The fin type is employed in order to increase the opposing surface area by means of a multilayering of metal film 12, and in order to thus increase the capacitance. However, it is also difficult to clean in the interior of the very detailed structure of the fin type, and furthermore, defects in resistance to insulation breakdown occur easily at edge areas thereof.

On the other hand, the stacked capacitor type is easier to manufacture than the trench capacitor type or the fin type, and furthermore, has superior reliability and yield.

Conventionally, a stacked capacitor type was produced in the following manner. To explain based on FIGS. 30 and 31, the surface of an N+ region 7 which was covered by an insulation film 3 was exposed by means of an RIE method (reactive ion etching), or the like, and a conductive film 12 was formed thereon by means of depositting polysilicon; after this, a resist 15 was formed with a desired pattern by means of resist application and photolithography (FIG. 30(a)) and a first electrode 12d was formed by means of RIE (FIG. 30(b)). Next, the polysilicon surface was oxidized by means of heating in an oxidizing atmosphere, and an insulation film 13 comprising polysilicon oxides was formed on the surface of the lower electrode 12d (FIG. 31(a)); after this, polysilicon was deposited over the entire surface by means of a CVD method, thus forming an upper electrode 14 (FIG. 31(b)). In accordance with this method, the insulation film 13 comprises $SiO_2$; however, as the dielectric constant of $SiO_2$ is low, having a value of 3.9, it was impossible to obtain an DRAM memory cell having large capacitance.

Attempts have been made to deposit, $Si_2N_3$ in the state shown in FIG. 31(b), which has a higher dielectric constant (dielectric constant: 8.0) than that of $SiO_2$, to utilize this $Si_2N_3$ as an insulation film (FIG. 31(a')), and to deposit polysilicon on top of this to form an upper electrode 14 (FIG. 31(b')). However, as the insulation film is a deposition film, it includes a plurality of pin holes, and accordingly, deficiencies in breakdown resistance occurred easily. Furthermore, attempts were made to close these pin holes by means of heating processing after the deposition of the $Si_2N_3$. However, in the course of these attempts, the surface of the $Si_2N_3$ was oxidized as a result of the heating processing, and became $SiN_xO_y$, so that the actual dielectric constant had a value within a range of 3.9–8, and the dielectric constant thus decreased in an undesirable manner as a result of the heating processing.

Thus, a semiconductor memory of dynamic type having a high breakdown voltage and having a capacitor with a large capacitance was not conventionally available.

It is an object of the present invention to provide DRAM memory cells which are easily manufactured, have a high breakdown voltage, and have a large capacitance.

SUMMARY OF THE INVENTION

In order to solve the above problems, the present invention provides a semiconductor memory of dynamic type which has capacitors for accumulating signal charges, each capacitor comprising 3 layers: a first electrode which is formed of an alloy made of 2 or more kinds of metallic elements, an insulation thin film made of the oxide of said alloy, and a second electrode formed with a metal.

Substrates which are suitable for use in the present invention include Si wafers, compound semiconductor wafers, and substrates in which a semiconductor film is formed on the surface of an insulation film.

No particular restriction is made with regard to the formation of the first region, which is of opposite conductive type from the substrate; for example, formation may be conducted by means of ion implantation.

No particular restriction is made with respect to the method of conducting the first process for the exposure of the surface of a first region of a substrate; for example, an RIE (reactive ion etching) method may be employed using a gas which is appropriate to the type of insulation film.

In the present invention, the first electrode comprises an alloy. This alloy should preferably be one in which a metal, the oxides of which have a high dielectric constant, forms the basic component. For example, a Ti system alloy is preferable. More particularly, for example, Ti-Ta, Ti-Al, Ti-Ba, Ti-Sr, and the like, are preferable. Of course, an alloy having as the basic component thereof a metal other than Ta is also acceptable. Furthermore, it should not be understood that only a 2-element system alloy is acceptable; a multielement system alloy having 3 or more elements is also acceptable.

In this manner, a semiconductor of dynamic type can be obtained having a high breakdown voltage and including capacitors for accumulating charges having a large capacitance, by means of forming the first electrode by means of an alloy. That is to say, for example, in the case in which the first electrode is formed by means of the metal Ti, the insulation film formed thereupon will comprise the Ti oxide $TiO_2$ is an oxide possessing a high dielectric constant; however, the insulation breakdown voltage strength thereof is low. On the other hand, in the case in which the first electrode is formed by means of Al, the insulation film which is formed thereupon will comprise the Al oxide $Al_2O_3$; $Al_2O_3$ has a high insulation breakdown voltage strength, but the dielectric constant thereof is low. In this manner, if the first electrode is formed thereupon by means of a metal, the insulation film which is formed thereupon will of necessity possess only that dielectric constant and insulation breakdown voltage strength which is particular to that metal.

However, in the case in which this electrode is formed by means of an alloy, by means of appropriately selecting the structural elements or the composition of the alloy, it is possible to form an insulation layer possessing a desired dielectric constant or insulation breakdown voltage strength.

It is possible for this alloy thin film to have a single layer structure; however, a multilayered structure possessing 2 or more layers is also acceptable. In the case of a multilayered structure having 2 or more layers, the formation of the lower layer by means of Cr is preferable, in that such formation increases the adhesion of the alloy thin film and the insulation film covering the surface of the substrate.

Materials used for the conductive thin film (upper electrode) include, for example, Ta, Ti, polysilicon, silicide, or other freely selected materials possessing conductivity.

No particular restrictions are made with respect to the formation methods for these alloy thin films and conductive thin films; however, it is permissible, for example, to use a DC-RF sputterring device O as shown in FIG. 22 of Patent Application First Publication, Laid-Open No. Sho 62-287071), in which an external bias voltage is applied to a substrate, and film formation thus conducted, or to use a 2-cycle excited sputterring device (as shown in FIG. 23 of Japanese Patent Application First Publication, Laid-Open No. Sho 63-50025), in which the RF power frequency is caused to differ on the side of the substrate $f_2$ and on the side of the target $f_1$. It should be understood that other methods are also possible; for example, the CVD method or the like may be employed.

The insulation thin film may be formed by direct oxidation of the alloy thin film.

An example of a direct oxidation method is a method in which the substrate is heated in an oxidizing gas atmosphere (for example, an atmosphere of $O_2$ gas or an atmosphere of a mixed gas of $O_2+N_2$ gas).

Furthermore, examples of a method for the oxidation of a substrate in a state in which the substrate is maintained at a low temperature include, for example, a method in which oxygen gas molecules are supplied to the surface of the metal film, and this surface is irradiated with inert gas ions having a kinetic energy of less than 90 eV. In this method, for example, when the metal surface is struck by Ar ions, the surface atomic layer is activated without creating defects. Ions having a kinetic energy of 25 eV penetrate only to a 2-3 atom layer of the surface, so that the energy is transmitted only to the surface. In addition, it is possible to effectively raise the temperature of the metal surface. When oxygen gas is simultaneously introduced into the deposition chamber, the oxygen molecules and the oxygen radicals produced by discharge are adsorbed by the metal surface, and cause a reaction with the metal at the metal surface, the temperature of which has been increased by Ar ion irradiation. By means of this process, the oxidation of the metal is furthered, Accordingly, it is possible to form a metal oxide film (for example, $Ta_2O_5$ film) having a thickness of 5–10 nm even if the substrate temperature is not raised to 400° C.; such formation is possible even at temperatures from 150°–200° C. Furthermore, if the energy of the irradiated ions is maintained at a level below 90 eV, no damage will be done to lower areas.

Examples of devices for irradiating ions having an energy of less than 90 eV in this manner include, for example, the devices shown in FIGS. 22 and 23; wherein, $O_2$ gas and Ar gas are introduced into the device, and plasma generation may be conducted in an atmosphere of 1 m Torr— tens of m Torr, under conditions in wherein the frequency on the substrate side is 50 MHz, the frequency on the target side is 200 MHz, and the RF power is set within a range of 10–50 W.

It is preferable to avoid the formation of a natural oxide film on the alloy thin film, by consecutively conducting the formation process of the first electrode and the formation process of the insulation film in the same vacuum device without disturbing the vacuum.

Furthermore, in the case in which the formation process of the first electrode and the formation process of the insulation film are not conducted in the same device, the transportation from the device in which the first electrode formation process was conducted to the device in which the insulation film formation process was conducted should be conducted in an atmosphere of an inert gas, or in a highly pure air atmosphere having a moisture concentration of less than 10 ppb. Of these, it is particularly preferable that transportation be conducted in a highly pure air atmosphere having a moisture concentration of less than 10 ppb.

In the case of inert gas, when a person makes a mistake during the process of transportation and sticks his head into the chamber, a state of oxygen deprivation results. However, in the case of an air atmosphere, such a state can be avoided. The discovery that an air atmosphere can be used in this manner was discovered for the first time by the present inventors. That is to say, it had been thought that in a gas atmosphere containing oxygen such as air, the surface of a substrate or the surface of metal wiring formed on a substrate was readily subject to natural oxidation. However, as a result of the diligent research of the present inventors, it was discovered that even if oxygen is contained in the atmosphere, if the moisture concentration is maintained at a level below 10 ppb, natural oxidation does not occur. Accordingly, it is possible to use atmospheric air if it is purified so as to have a moisture concentration of less than 10 ppb.

It is possible to use, as the substrate transfer mechanism, a mechanism such as that shown in FIG. 24, in which various devices 302-305 are connected by means of a tunnel 301. This tunnel is isolated from the outside atmosphere, and a gas having a moisture concentration of less than 10 ppb is caused to flow through the interior of tunnel 301.

Within tunnel 301, gas is injected so as to be in contact with the lower surface of the substrates, so that by means of this gas, it is possible to transport the substrates in a suspended manner.

However, it is also possible to transport the substrates by means of a device such as that shown in FIG. 25, in which a box 306, the interior of which is filled with a gas having a moisture concentration of less than 10 ppb, is used for this transportation.

BRIEF DESCRIPTION OF THE DRAWINGS

Other characteristics and advantages of the invention will be more apparent from the following detailed description of several preferred embodiments thereof, taken with reference to the accompanying drawings, in which.

DETAILED DESCRIPTION OF THE PREFERRED EMBODIMENTS

Hereinbelow, embodiments of the present invention will be explained based on the diagrams.

EMBODIMENT 1

Figure 1:
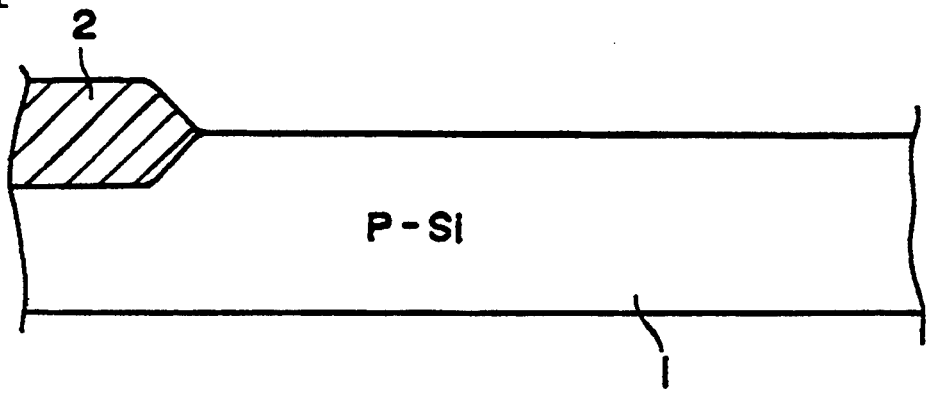
FIG. 1 is a process cross sectional diagram in accordance with a first embodiment of the present invention.

A manufacturing process of Embodiment 1 is shown in FIG. 1.

In the present example, a P-type Si substrate 1 was used as the semiconductor substrate.

On an Si substrate 1, a $SiO_2$ field oxidation film 2 having a thickness of approximately 1 μm is formed by means of LOCOS (local oxidation of silicon) (FIG. 1).

Figure 2:
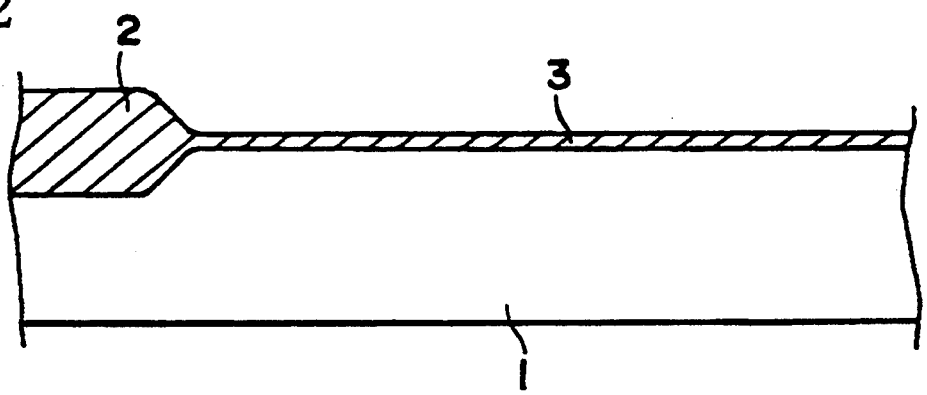
FIG. 2 is a process cross sectional diagram in accordance with a first embodiment of the present invention.

Next, a 10 nm gate oxidation film 3 is formed on the surface of substrate 1 by means of heating for 30 minutes at a temperature of 900° C. in a dry oxygen atmosphere (FIG. 2).

Figure 3:
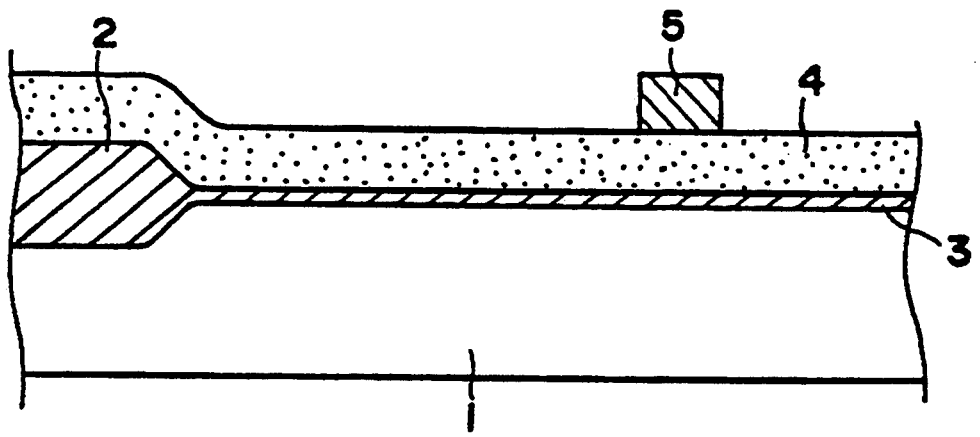
FIG. 3 is a process cross sectional diagram in accordance with a first embodiment of the present invention.

Next, an N+ polysilicon layer 4, which serves as the lower electrode, is deposited over the entire surface by means of the LPCVD method, and after resist has been applied on top of this, this resist 5 is formed into a pattern by means of photolithography (FIG. 3).

Figure 4:
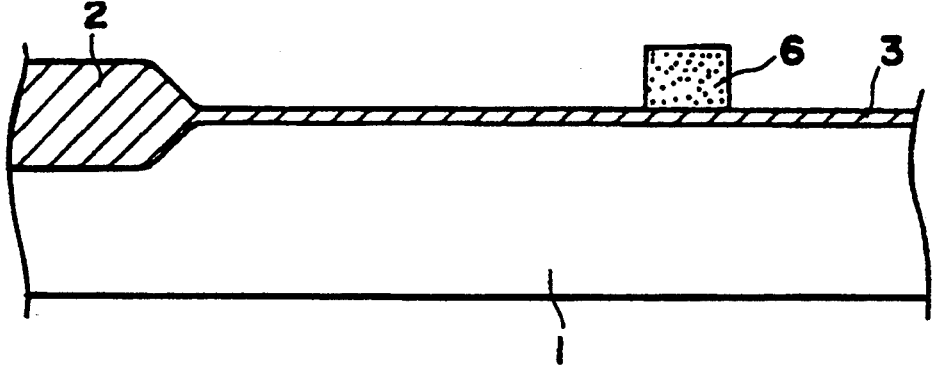
FIG. 4 is a process cross sectional diagram in accordance with a first embodiment of the present invention.

Next, resist 5 is subjected to masking by means of RIE, polysilicon 4 is removed, and gate electrode (word line) 6 is formed (FIG. 4).

Figure 5:
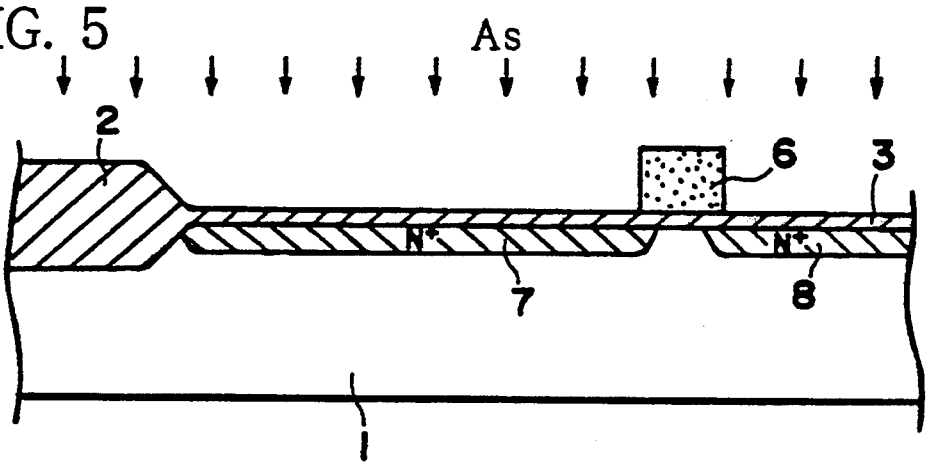
FIG. 5 is a process cross sectional diagram in accordance with a first embodiment of the present invention.

Next, gate electrode 6 is subjected to masking, and the entire surface is subjected to ion implantation using As at 50 kV, and at a density of $5 \times 10^{15}/cm^2$. After this, annealing is conducted in an atmosphere of $N_2$ for a period of 30 minutes at a temperature of 900° C., and thereby, the defects created by the ion implantation are repaired and N+ regions 7 and 8 are formed (FIG. 5).

Figure 6:
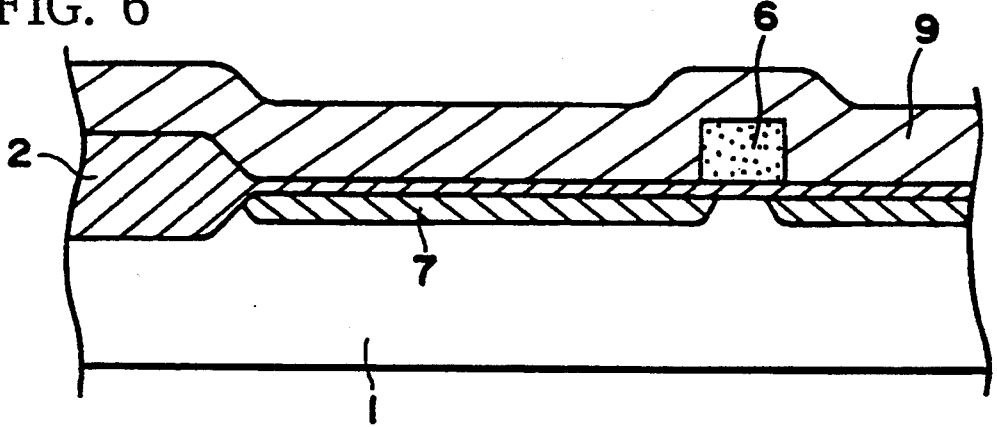
FIG. 6 is a process cross sectional diagram in accordance with a first embodiment of the present invention.

Next, $SiH_4$ and $O_2$ are reacted by means of a normal pressure CVD method, and an $SiO_2$ film 9 is deposited over the entire surface (FIG. 6).

Next, contact holes are formed, and the surface of the N+ region is exposed.

Figure 7:
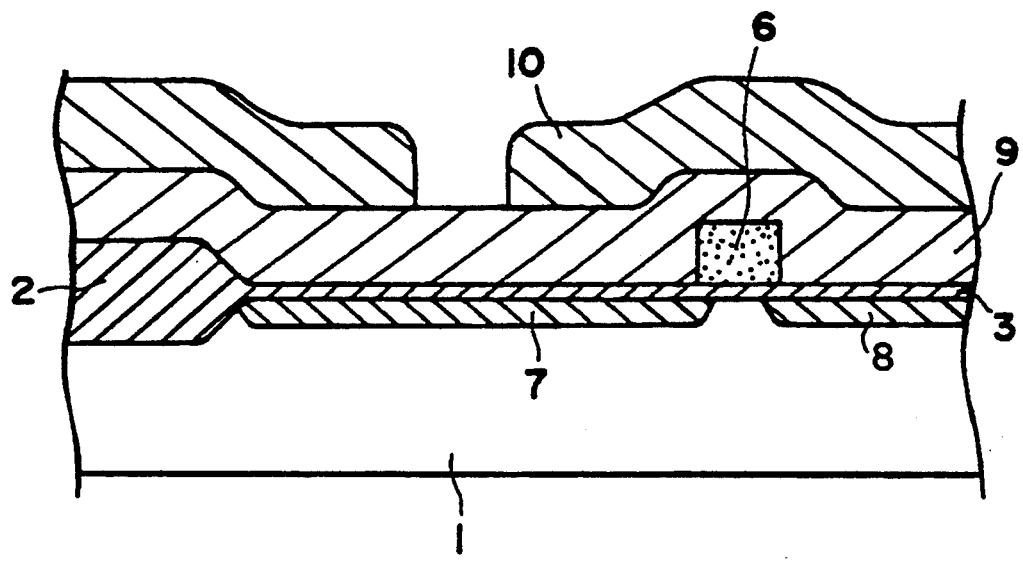
FIG. 7 is a process cross sectional diagram in accordance with a first embodiment of the present invention.
Figure 8:
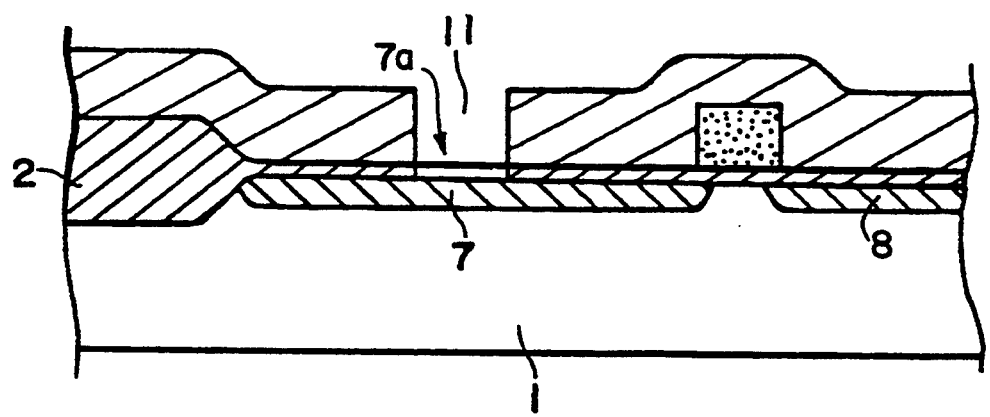
FIG. 8 is a process cross sectional diagram in accordance with a first embodiment of the present invention.

First, resist is applied onto the $SiO_2$ film 9, and a resist pattern is formed by means of photolithography (FIG. 7). Next, the resist 10 is subjected to masking, and $SiO_2$ film 9 and a portion of gate oxide film 3 are subjected to etching by means of RIE, a portion 7a above of the surface of N+ region 7 Is exposed, and contact hole 11 is formed (FIG. 8).

Next, the first electrode formation process is carried out in the following manner.

Figure 9:
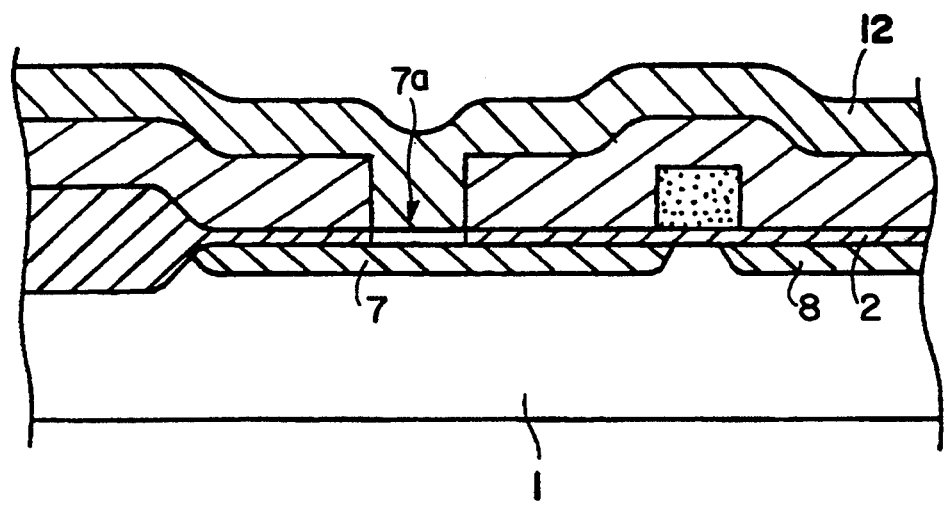
FIG. 9 is a process cross sectional diagram in accordance with a first embodiment of the present invention.
Figure 22:
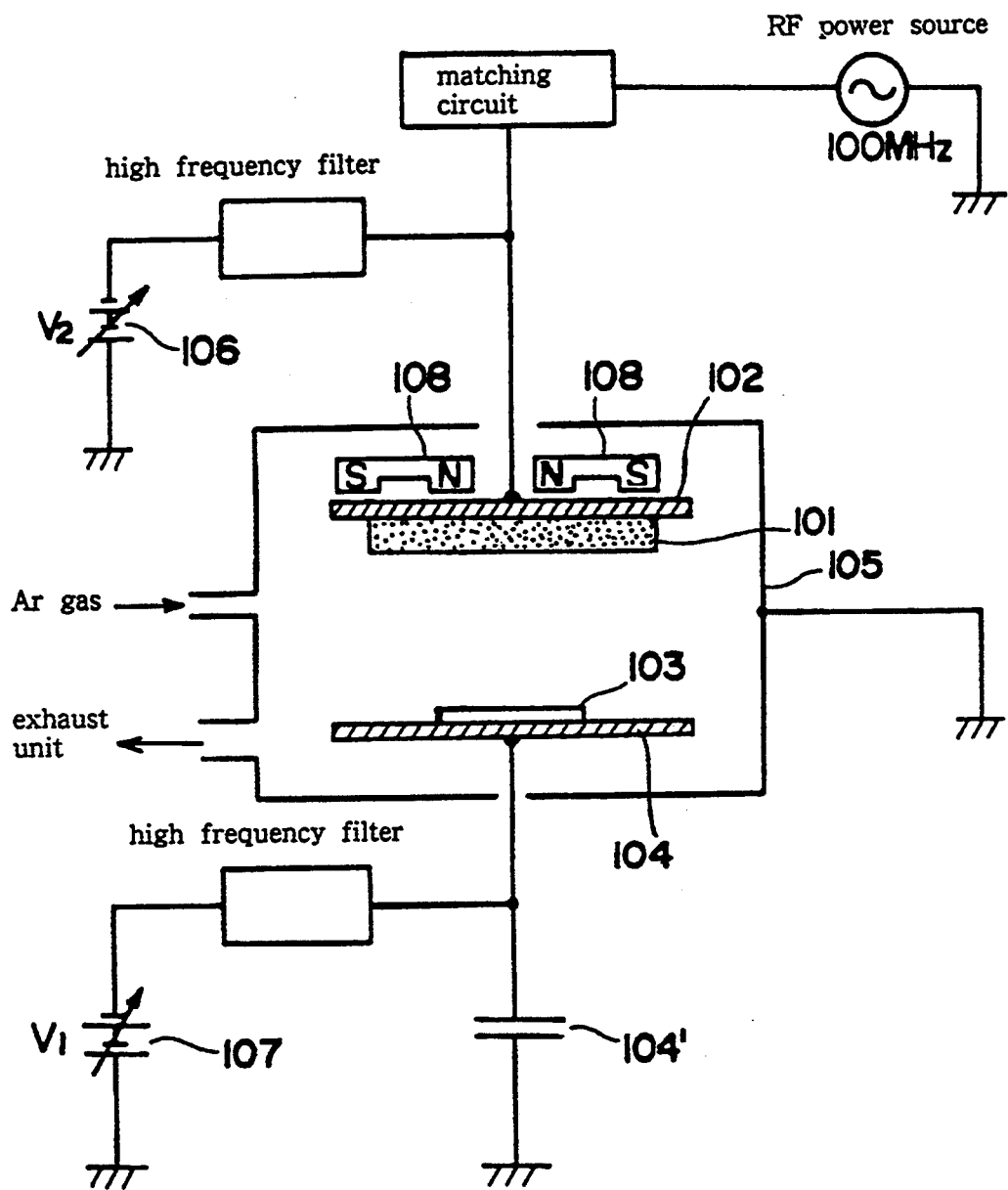
FIG. 22 is a conceptual drawing of an example of a device used in the formation of a film and the like in the present invention.
Figure 23:
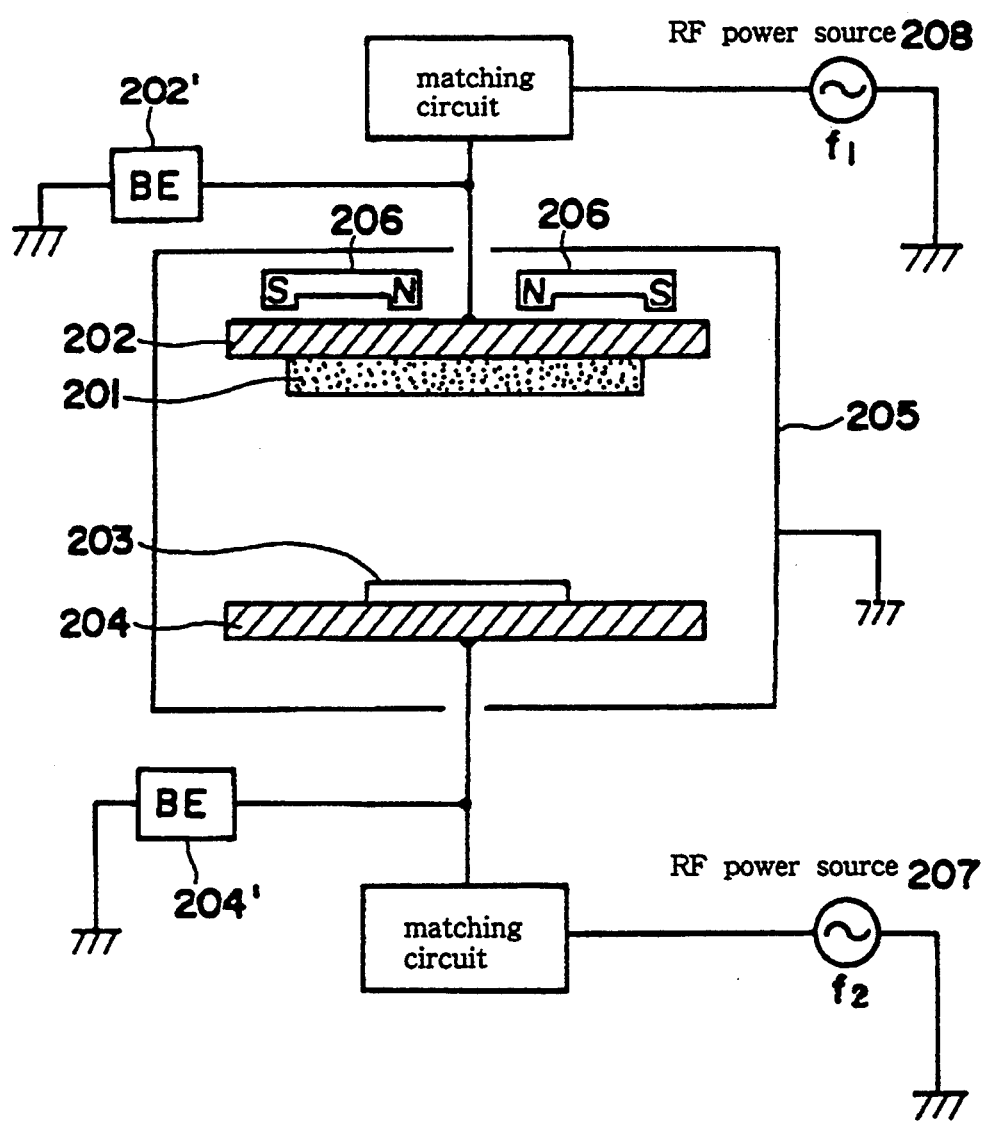
FIG. 23 is a conceptual drawing of an example of a device used in the formation of a film and the like in the present invention.

The substrate is placed in a DC-RF coupling sputterring device such as that shown in FIG. 22, the film deposition chamber is placed in a super high vacuum state with a vacuum degree of less than $10^{-10}$ Torr, and subsequently, Ar gas is introduced, and a Ti-Al alloy film 12 having a thickness of 300 nm is deposited by means of sputterring. At this time, at the beginning of film formation and during film formation, film formation is conducted while irradiating the surface with Ar ions having a low energy in the tens of eV. By means of such irradiation, a Ti-Al alloy film 12 having extremely good crystallization can be obtained (FIG. 9).

Next, the insulation film formation process is carried out in the following manner.

Figure 10:
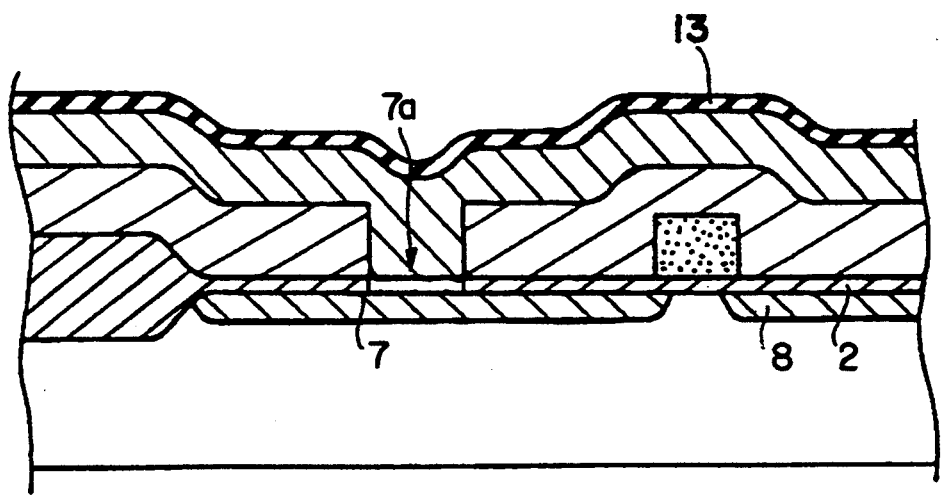
FIG. 10 is a process cross sectional diagram in accordance with a first embodiment of the present invention.

In the present example, the first electrode formation process and the insulation film formation is carried out in the same device. That is to say, after the completion of the first electrode formation process, oxidizing gas is introduced into the device and the oxidation of the Ti-Al alloy film 12 is conducted. It should of course be understood that at this time, the RF power is not applied, so that sputterring is not being conducted. The oxidation of Ti-Al alloy film 12 is accomplished by heating the substrate to a temperature of 400° C. and introducing an oxygen gas having a moisture concentration of less than 10 ppb, and thereby, a mixed film 13 of $TiO_2$ and $Al_2O_3$ having a thickness of 5 nm is formed (FIG. 10).

Next, the formation of the second electrode is carried out in the following manner.

Figure 11:
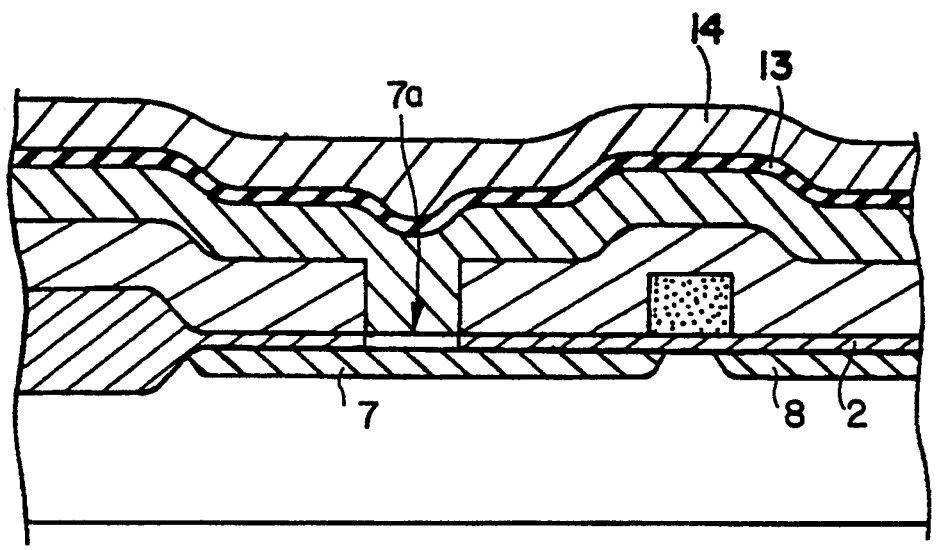
FIG. 11 is a process cross sectional diagram in accordance with a first embodiment of the present invention.

That is to say, the substrate is transported from oxidation device 304 to film deposition device 305 through the medium of tunnel 301, and there, in a manner identical to that in which the first electrode formation process was conducted, a Ta film 14 is formed as a conductive thin film (FIG. 11).

Next, the formation of an interlayer insulation film and multilayer wiring is conducted as follows.

Figure 12:
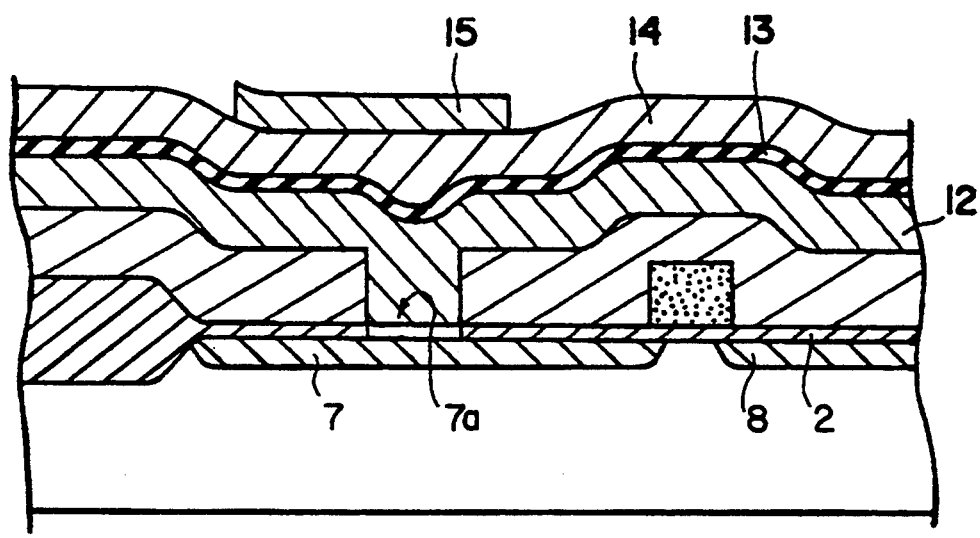
FIG. 12 is a process cross sectional diagram in accordance with a first embodiment of the present invention.
Figure 13:
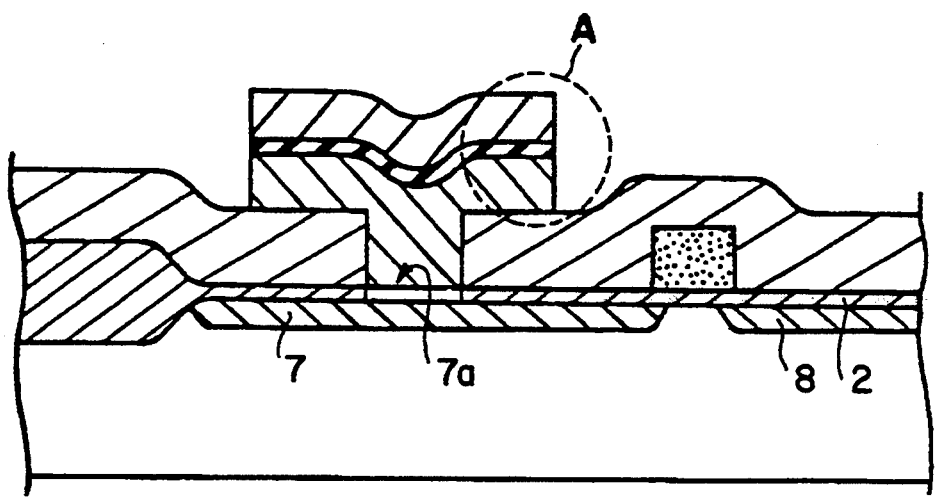
FIG. 13 is a process cross sectional diagram in accordance with a first embodiment of the present invention.

First, resist 15 is formed into a pattern such that the resist remains only directly above N+ region 7 (FIG. 12). Next, the resist 15 is subjected to masking, and Ta film 14 is subjected to RIE etching using $CF_4$ gas, and furthermore, $Ta_2O_5$ 13 is subjected to RIE etching using $CF_4/H_2$ gas, and then Ti-Al alloy film 12 is subjected to RIE etching using $CF_4$ gas (FIG. 13).

Next, after the removal of the resist, a $SiO_2$ film (PSG film) 17 containing P, or a $SiO_2$ film 17, is formed over the entire surface using a normal pressure CVD process. It is possible to deposit a BPSG film in place of the PSG film.

Figure 14:
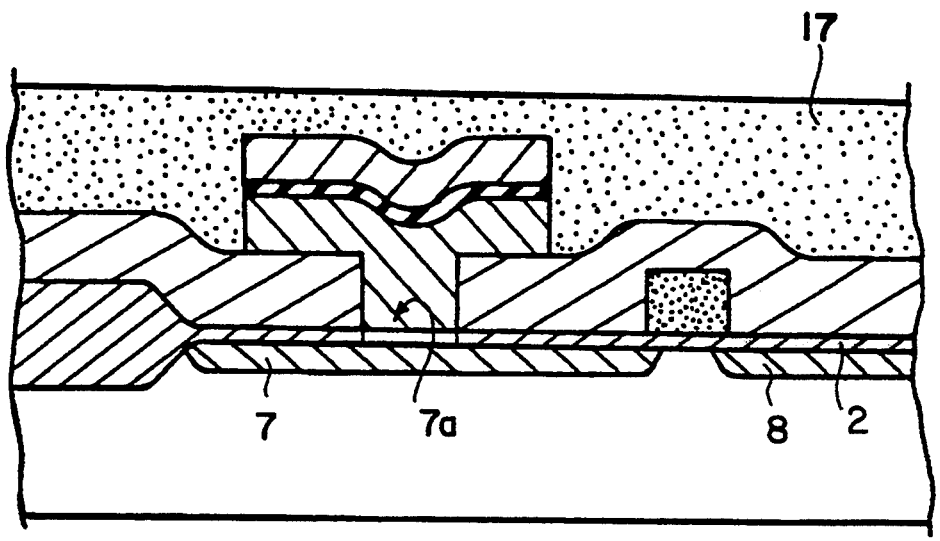
FIG. 14 is a process cross sectional diagram in accordance with a first embodiment of the present invention.

In the present example, the subsequent lithography is conducted with a high degree of precision, so that the surface of PSG film 17 is subjected to flattening (FIG. 14). This flattening may be accomplished, for example, by means of a bias sputterring method or by means of an etching method. It should be understood that other methods may be employed.

Figure 15:
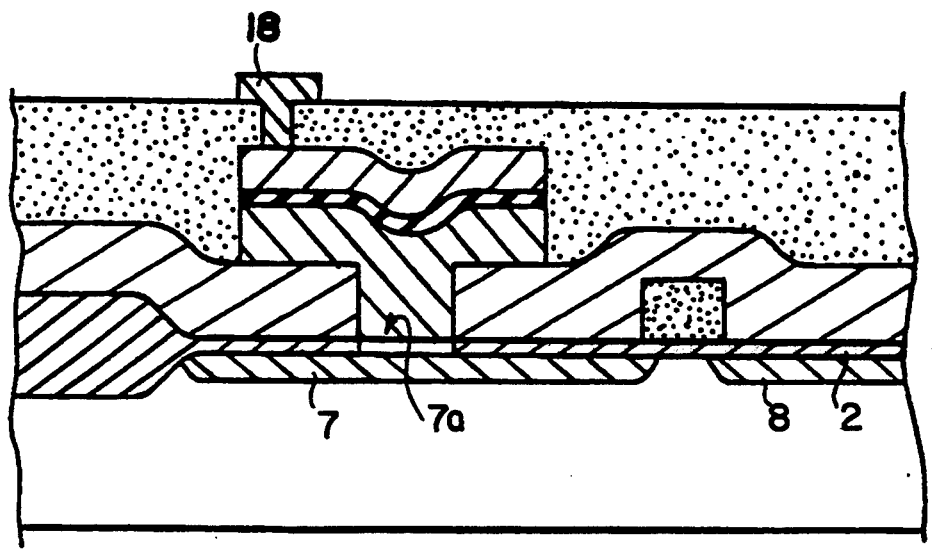
FIG. 15 is a process cross sectional diagram in accordance with a first embodiment of the present invention.

Next, contact holes are opened, and the formation of Al wiring 18, which functions as the first wiring, is accomplished (FIG. 15).

Figure 16:
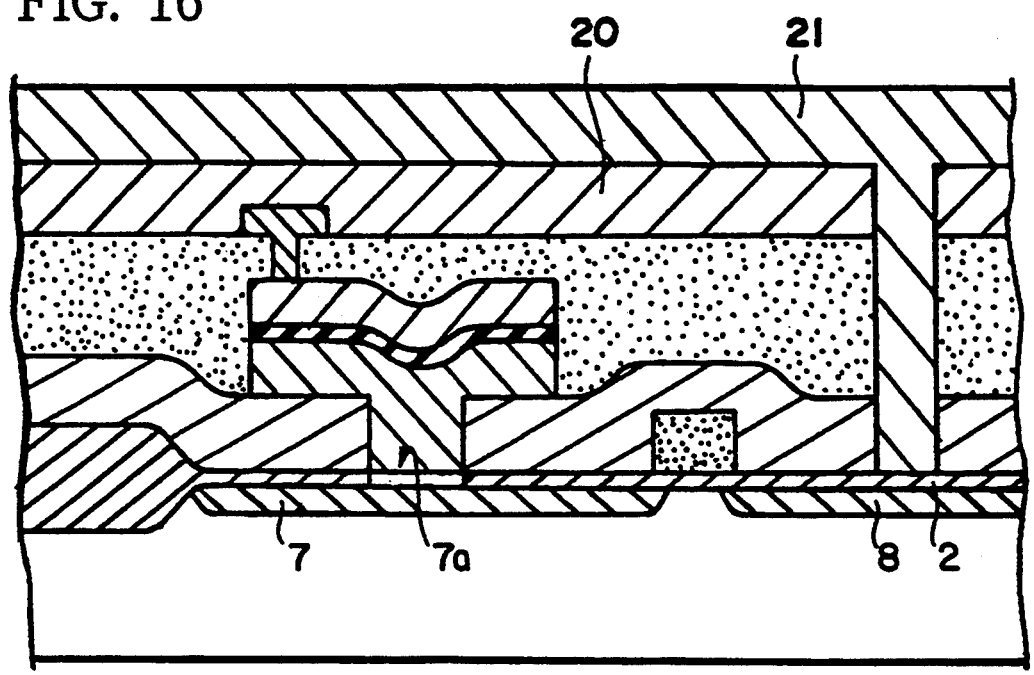
FIG. 16 is a process cross sectional diagram in accordance with a first embodiment of the present invention.

Next, a PSG film 20, which functions as a further interlayer insulation film, is formed by means of a sputterring method, etching is conducted by means of an RIE method, and contact holes are opened; thereafter, Al is deposited in contact with the $SiO_2$ field oxidation film 2 above the N+ region 8, and a bit line 21 is formed (FIG. 16).

The formation of PSG film 20 may be accomplished by means of a plasma CVD method or a spin-on-glass method.

Figure 17:
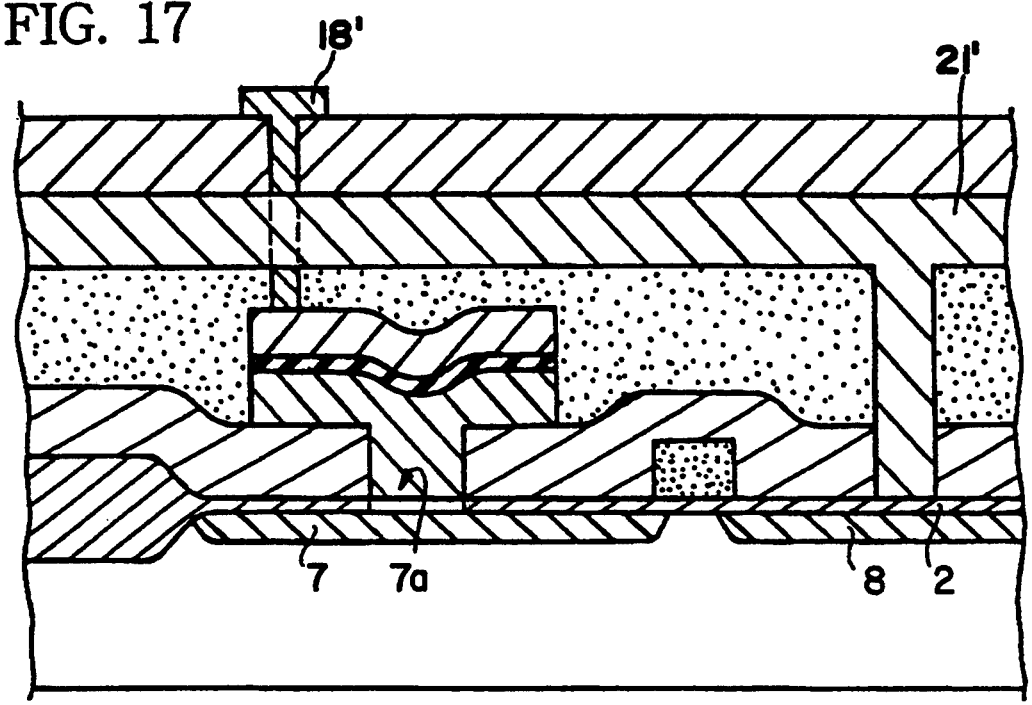
FIG. 17 is a process cross sectional diagram in accordance with a first embodiment of the present invention.
Figure 18:
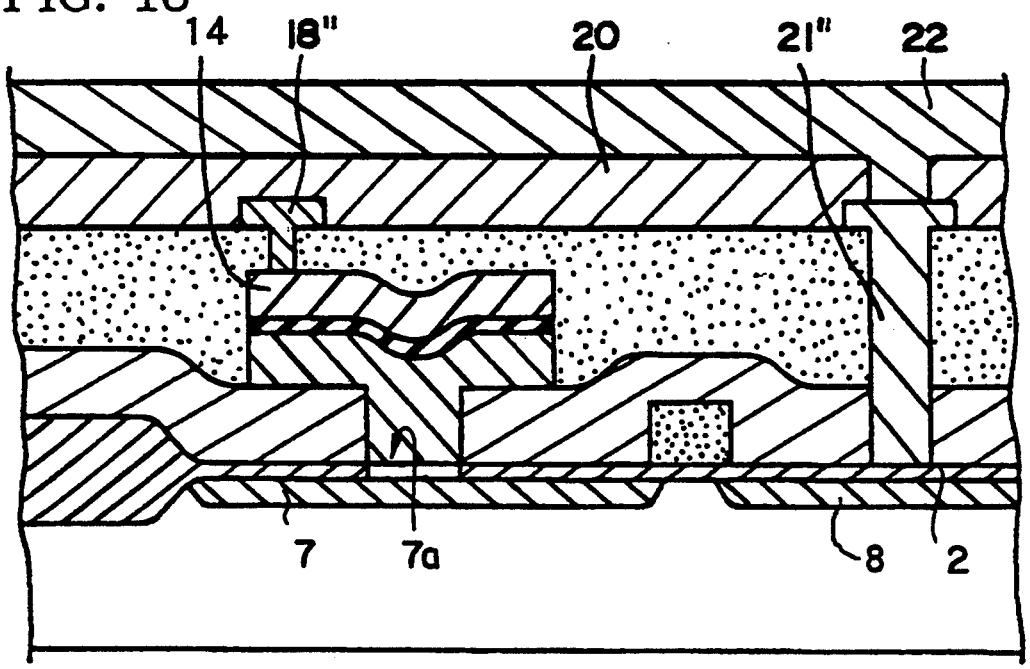
FIG. 18 is a process cross sectional diagram in accordance with a first embodiment of the present invention.

As shown in FIG. 17, after the formation of bit line 21', it is permissible to form Al wiring 18'. Furthermore, as shown in FIG. 18, it is permissible to simultaneously form Al wiring 18", which in contact with the Ta film 14, and Al wiring 21", which in contact with the $SiO_2$ field oxidation film 2 above the N+ region 8, and then finally to form bit line 22.

EMBODIMENT 2

Figure 24:
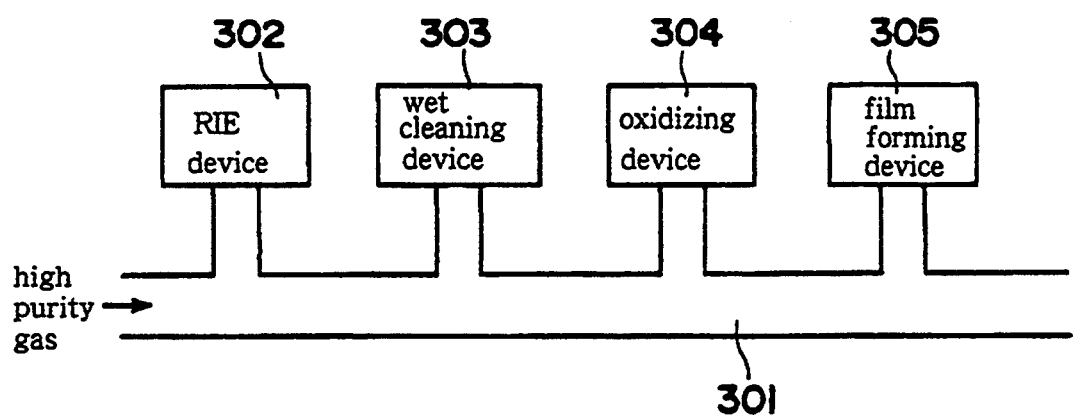
FIG. 24 is a conceptual drawing showing an example of a transportation mechanism.
Figure 25:
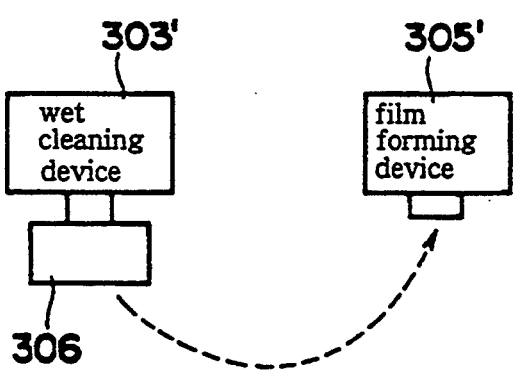
FIG. 25 is a conceptual drawing showing an example of a transportation mechanism.
Figure 26:
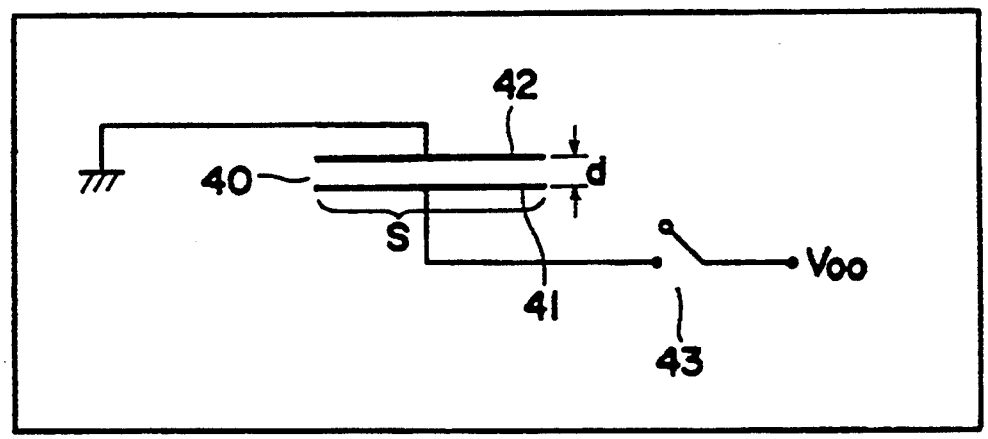
FIG. 26 is an equivalent circuit diagram of a DRAM memory cell.
Figure 27:
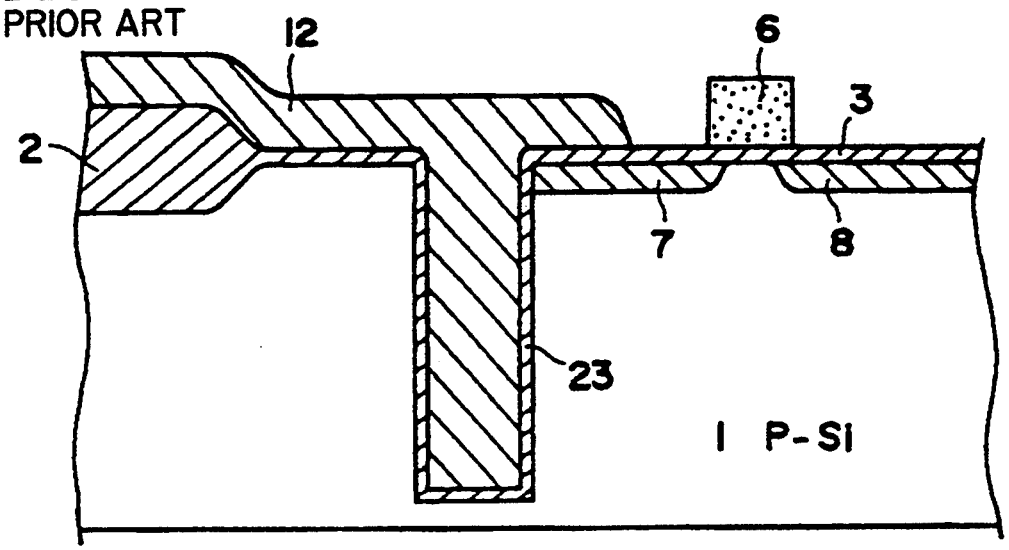
FIG. 27 is a cross sectional diagram showing the structure of a DRAM memory cell.
Figure 28A:
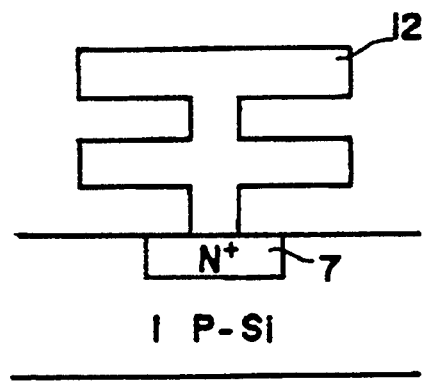
FIGS. 28(a) and 28(b) depict a cross sectional diagram showing the structure of a conventional DRAM memory cell.
Figure 28B:
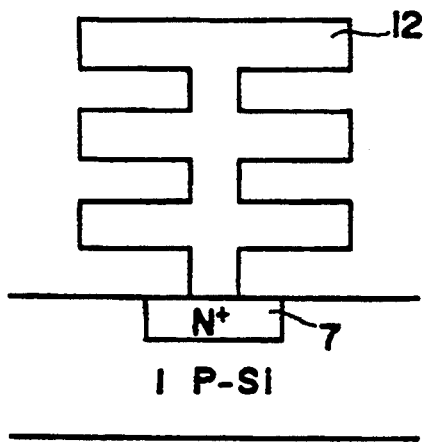
Figure 29:
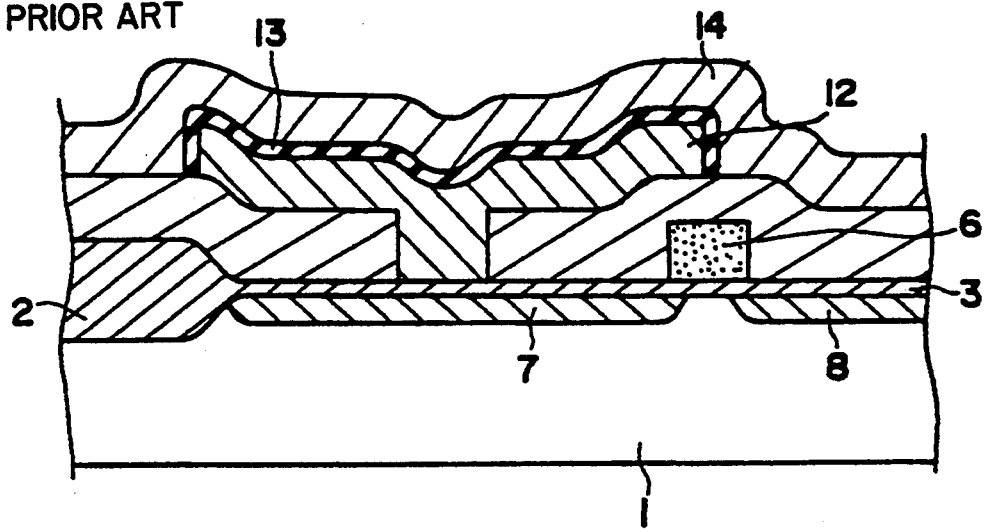
FIG. 29 is a cross sectional diagram showing the structure of a conventional DRAM memory cell.
Figure 30A:
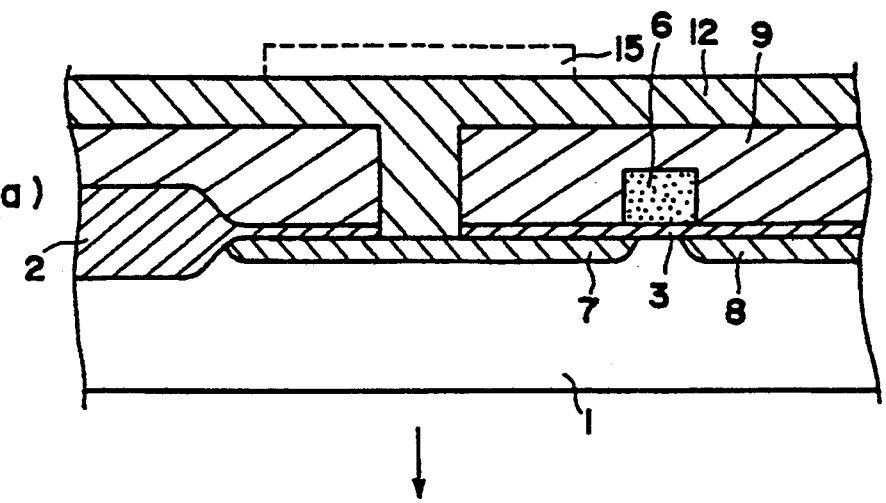
FIGS. 30(a) and 30(b) depict a process cross sectional diagram showing a conventional manufacturing method for DRAM memory cells.
Figure 30B:
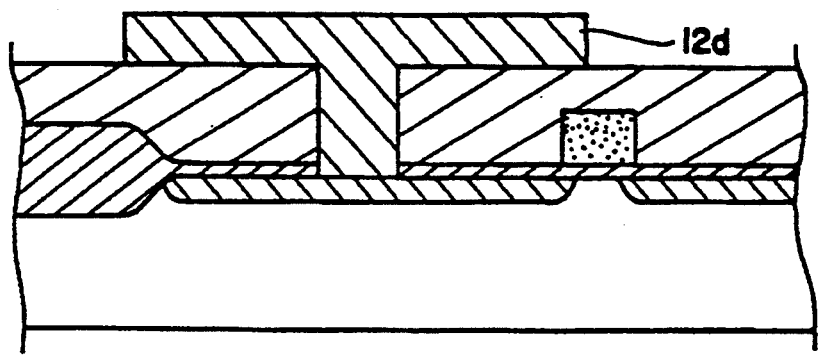
Figure 31A:
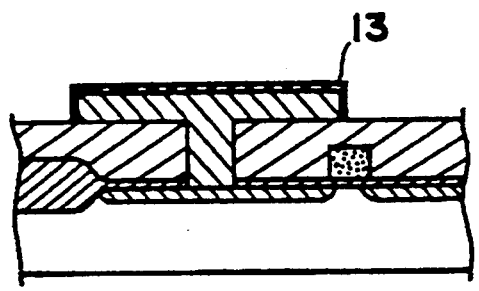
FIGS. 31(a), 31(a'), 31(b), 31(b') depict a process cross sectional diagram showing a conventional manufacturing method for DRAM memory cells.
Figure 31A:
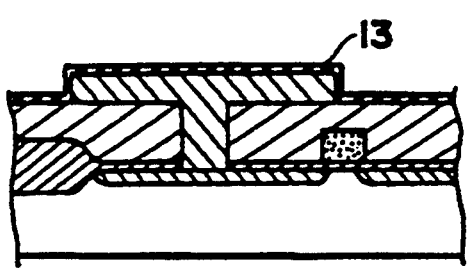
Figure 31B:
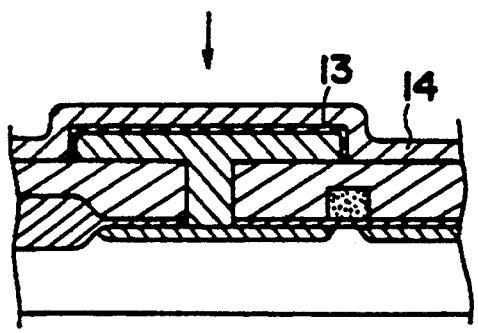
Figure 31B:
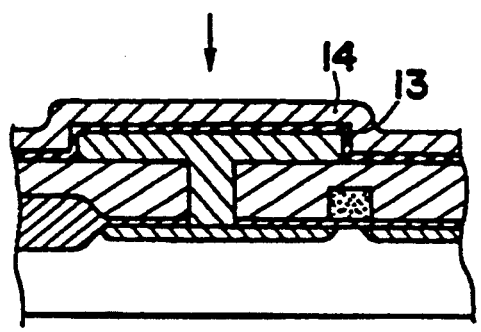
Figure 8:
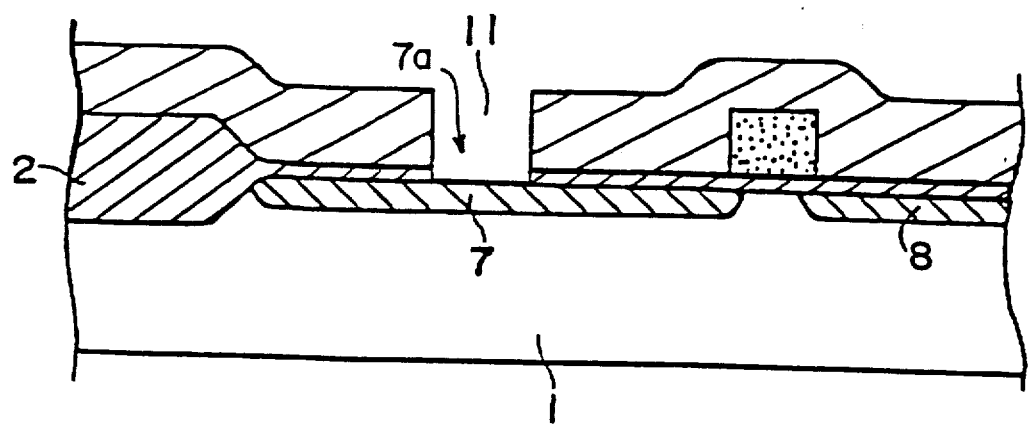
Figure 9:
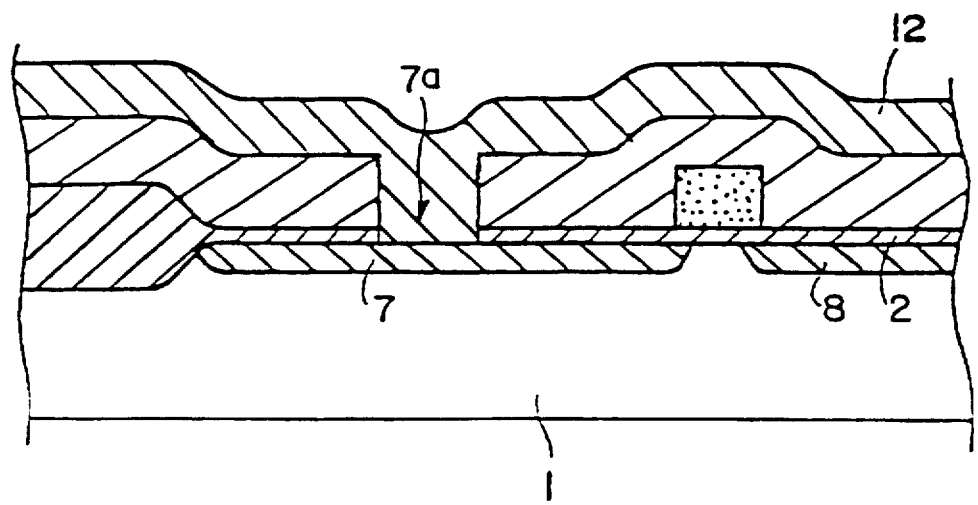
Figure 10:
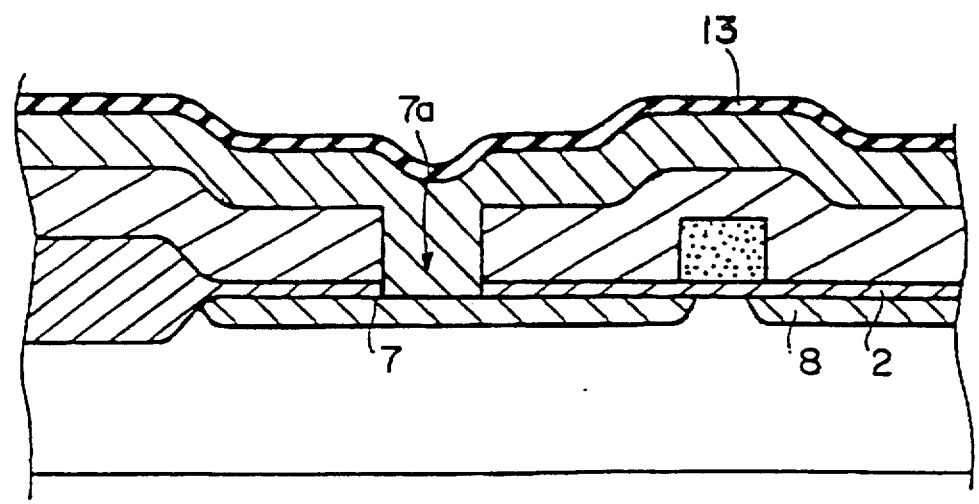
Figure 11:
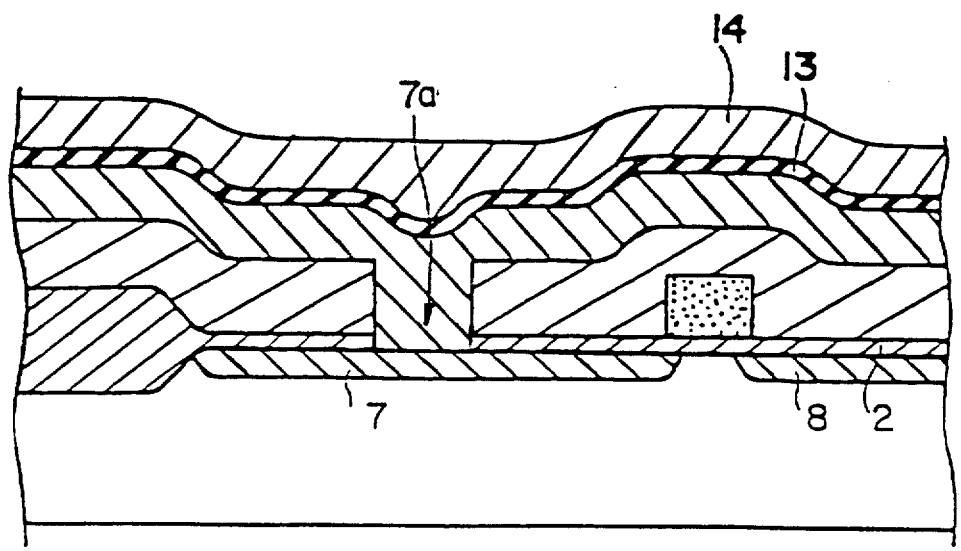
Figure 12:
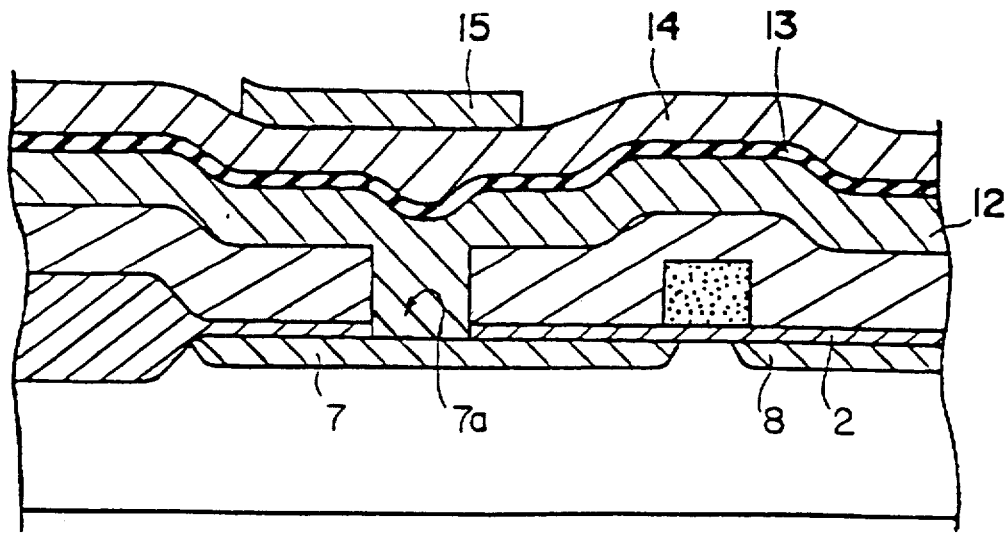
Figure 13:
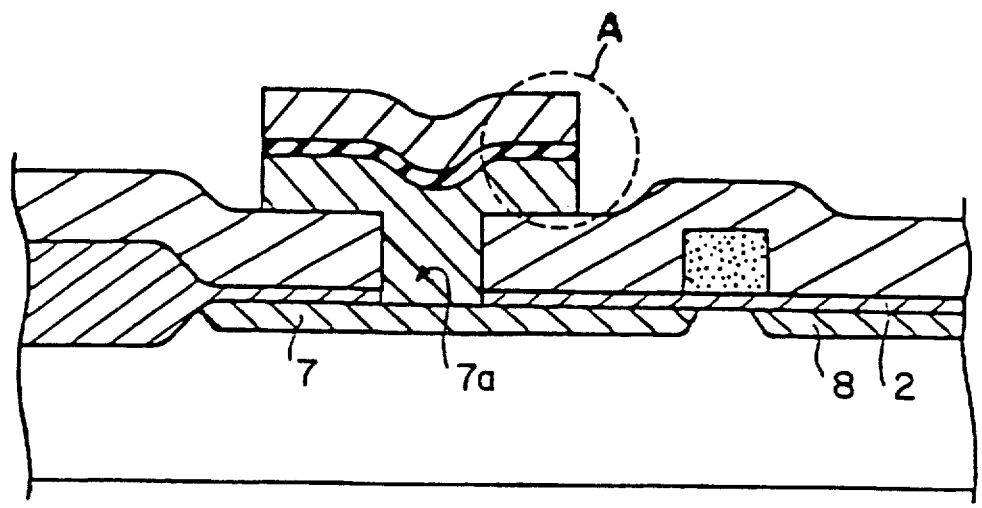
Figure 14:
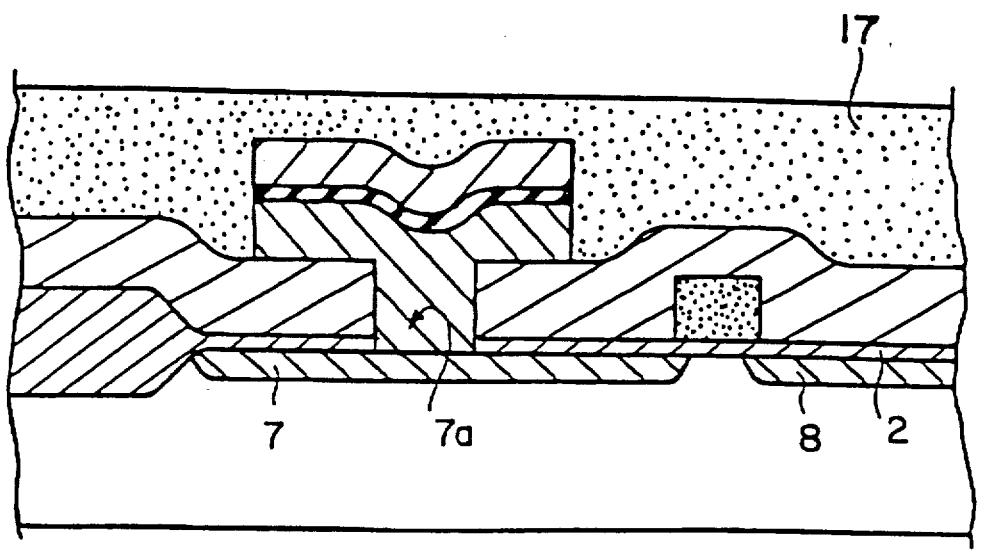
Figure 15:
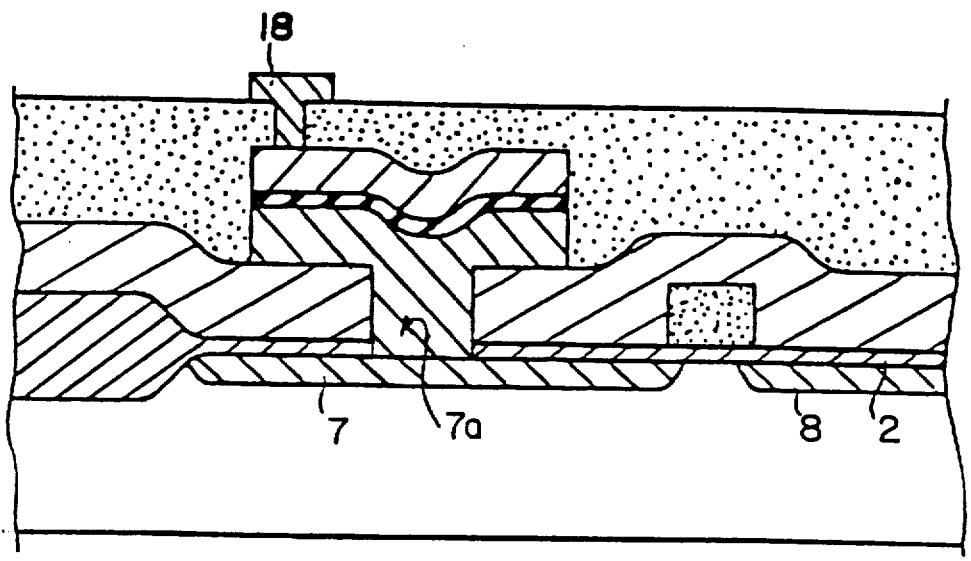
Figure 16:
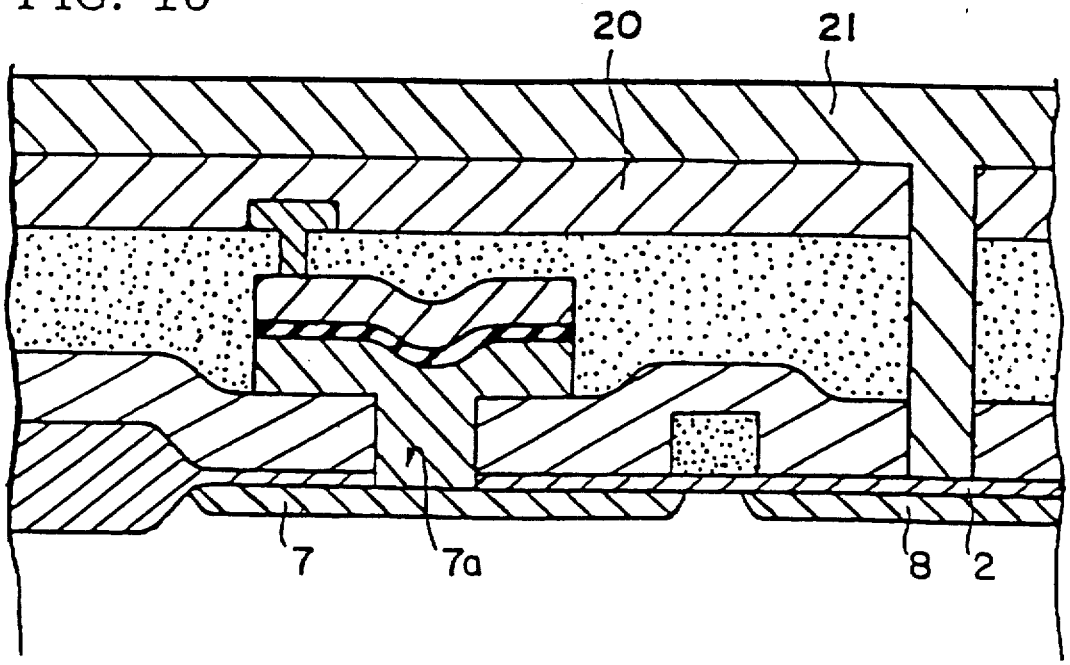
Figure 17:
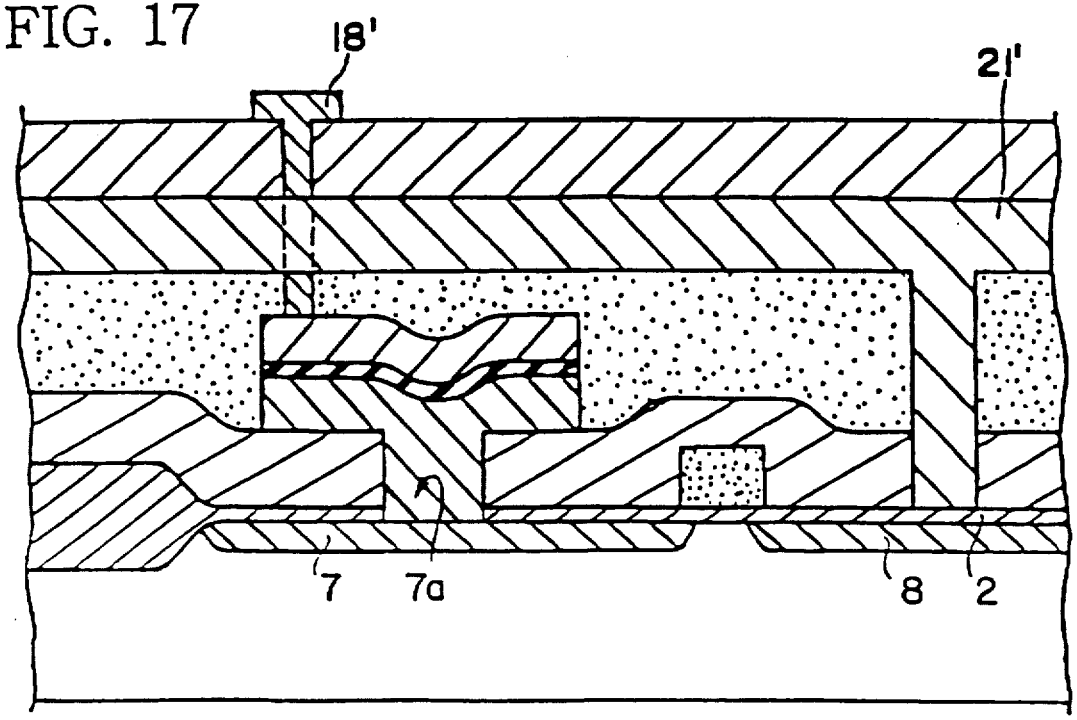
Figure 18:
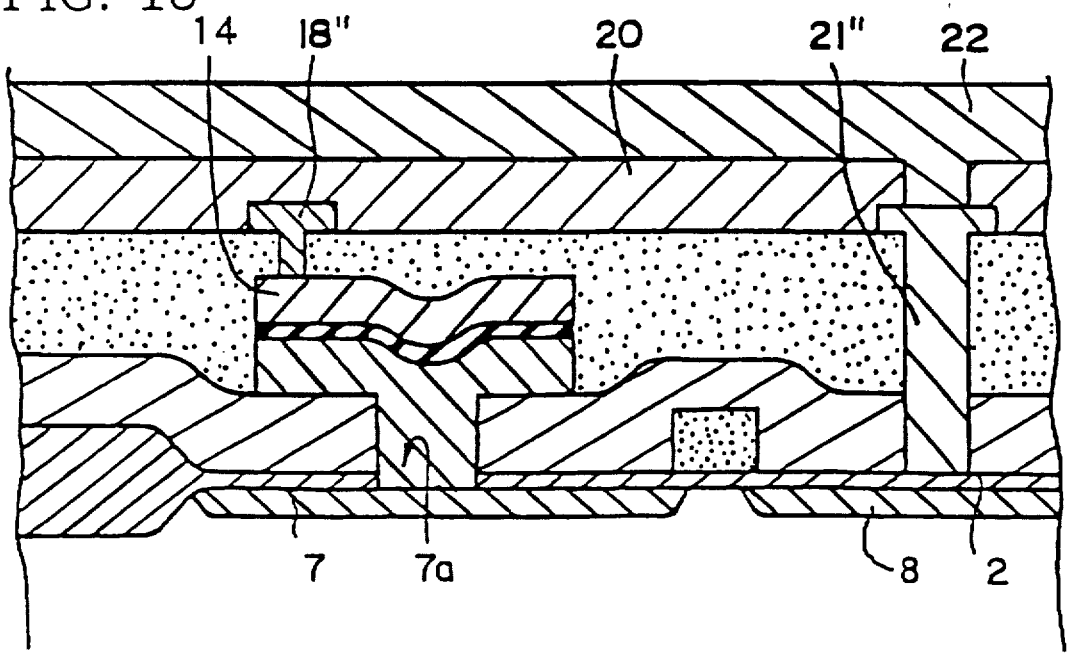
Figure 20A:
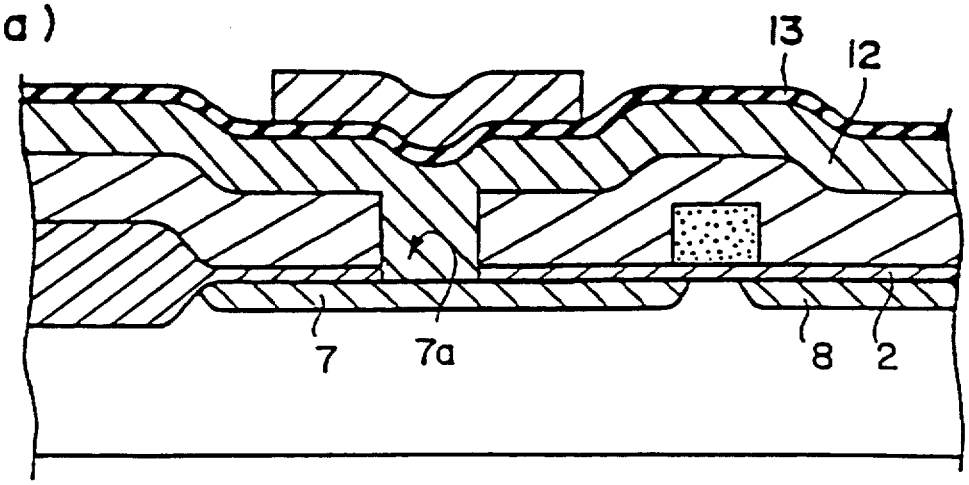
Figure 20B:
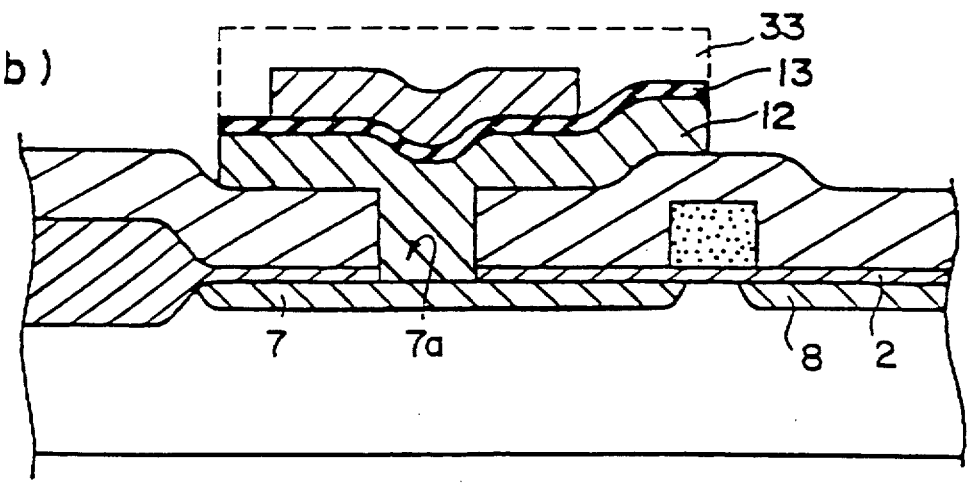
Figure 21A:
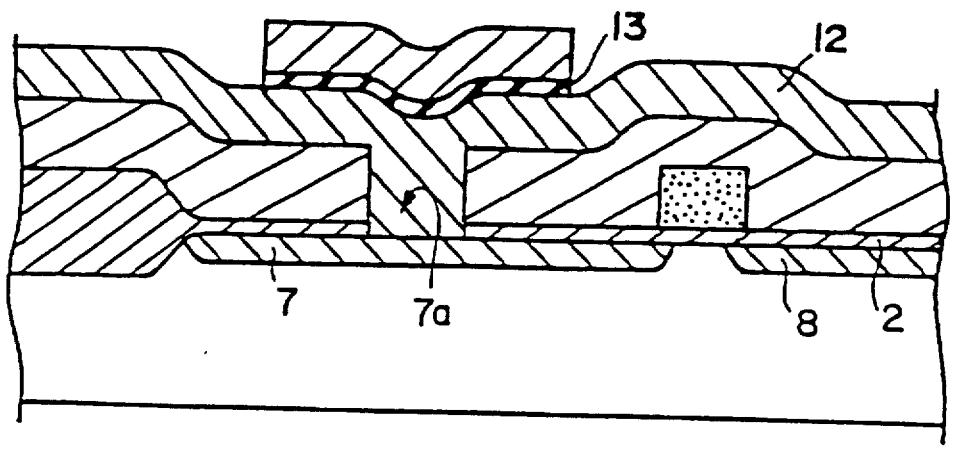
Figure 21B:
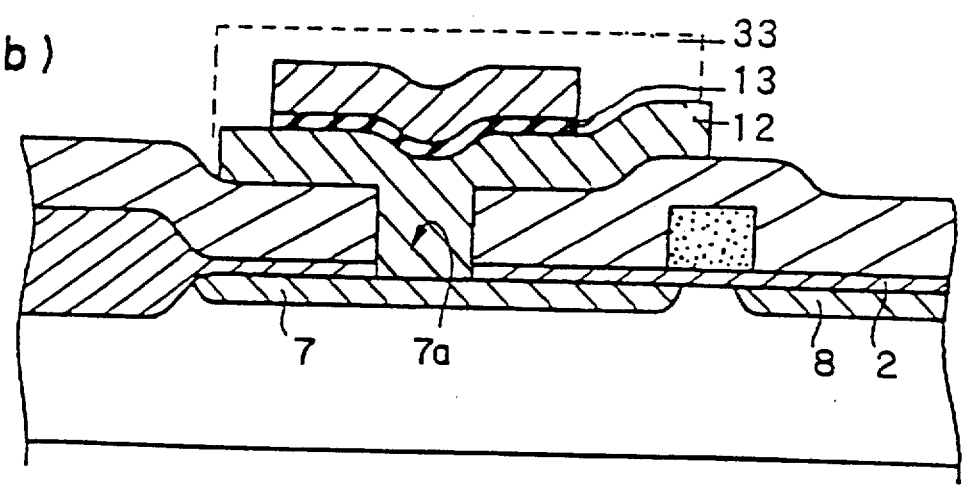

In the present example, after the completion of the first electrode formation process, the substrate is transported to an oxidation device through the medium of the tunnel 301 having the structure shown in FIG. 24, and oxidation processing is conducted in the oxidation device. The atmosphere in the interior of tunnel 301 is maintained so as to comprise a highly pure air atmosphere having a moisture content of less than 10 ppb.

EMBODIMENT 3

Figure 19A:
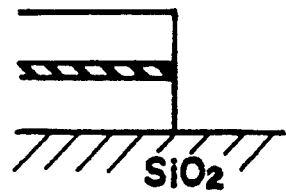
FIGS. 19(a) and 19(b) depict a process cross sectional diagram in accordance with a third embodiment of the present invention.
Figure 19B:
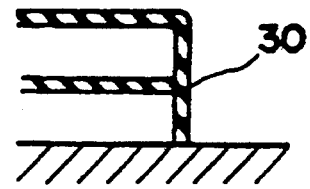

In the present example, in the state of Embodiment 1 shown in FIG. 13, oxidation Is conducted. By means of such oxidation, the edge regions which were damaged as a result of etching (the region A of FIG. 13, and FIG. 19(a)) have oxidized films 30 formed at side surfaces thereof (FIG. 19(a)), so that a distinct improvement in breakdown resistance is achieved.

EMBODIMENT 4

Figure 20A:
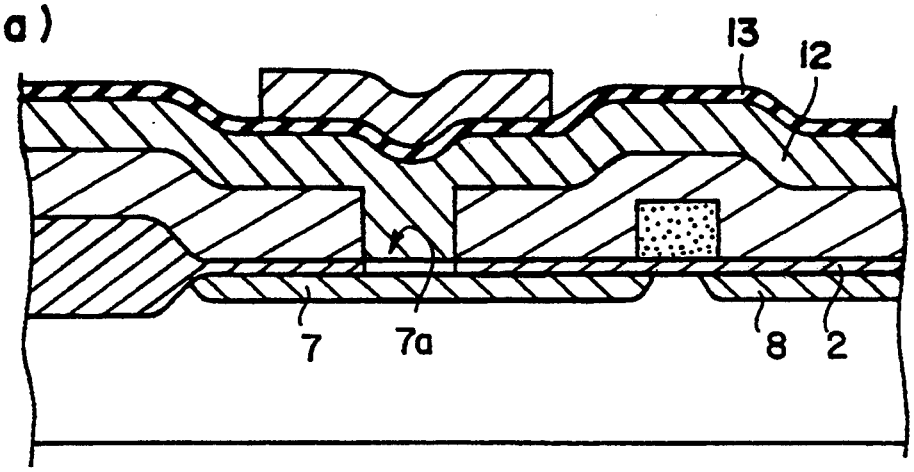
FIGS. 20(a), 20(b), 20(c), 20(d) depict a process cross sectional diagram in accordance with a fourth embodiment of the present invention.
Figure 20B:
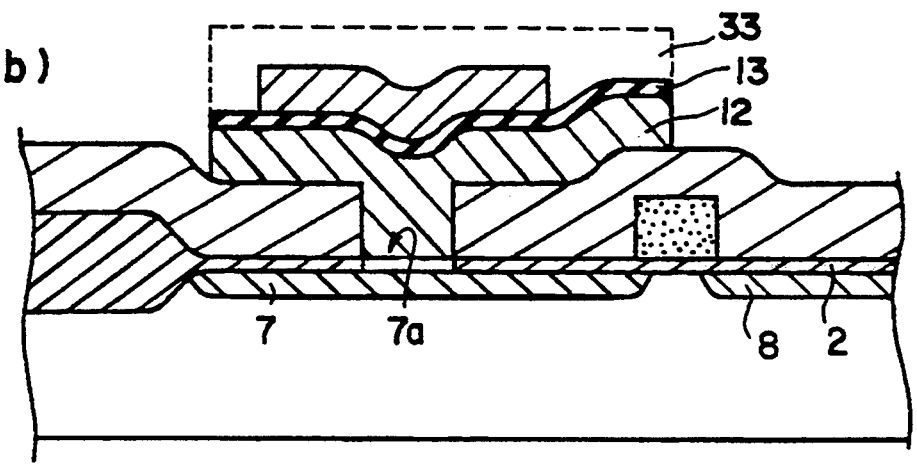
Figure 20C:
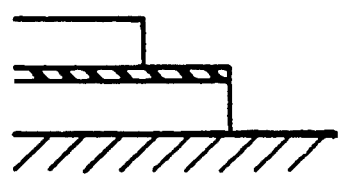

In the present example, the process followed is identical to the process of embodiment 1 shown in FIG. 12; however, when RIE etching is conducted in the state shown in FIG. 12, only etching of Ta film 14 is conducted, and after the completion of the etching of Ta film 14 (FIG. 20(a)), resist is again applied, and a resist pattern 33 is formed by means of photolithography (FIG. 20(b)), RIE etching is conducted, and the edge regions have the structure shown in FIG. 20(c).

Figure 20D:
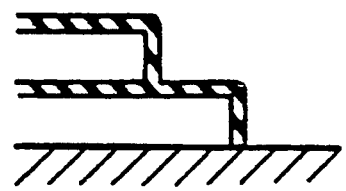

In order to further increase the resistance to breakdown, in a manner similar to that of Preferred Embodiment 3, oxidation processing is conducted, and the oxide film shown in FIG. 20(d) is formed.

EMBODIMENT 5

Figure 21A:
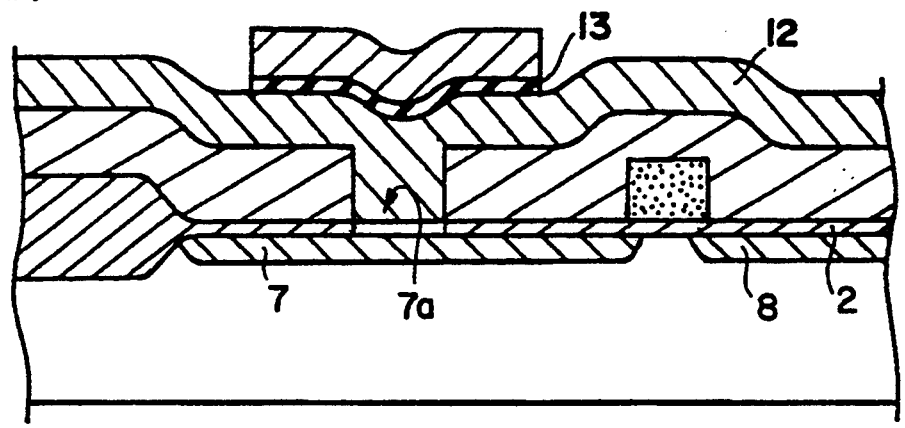
FIGS. 21(a), 21(b), 21(c), 21(d) depict a process cross sectional diagram in accordance with a fifth embodiment of the present invention.

In Preferred Embodiment 4, in the state shown in FIG. 12, etching of only the Ta film 14 was conducted; however, in the present example, the Ta film 14, and the mixed film 13 of $TiO_2$ and $Al_2O_3$ is subjected to etching. However, this example is distinguished from Embodiment 1 in that Ti-Al alloy film 12 is allowed to remain (FIG. 21(a)).

Figure 21B:
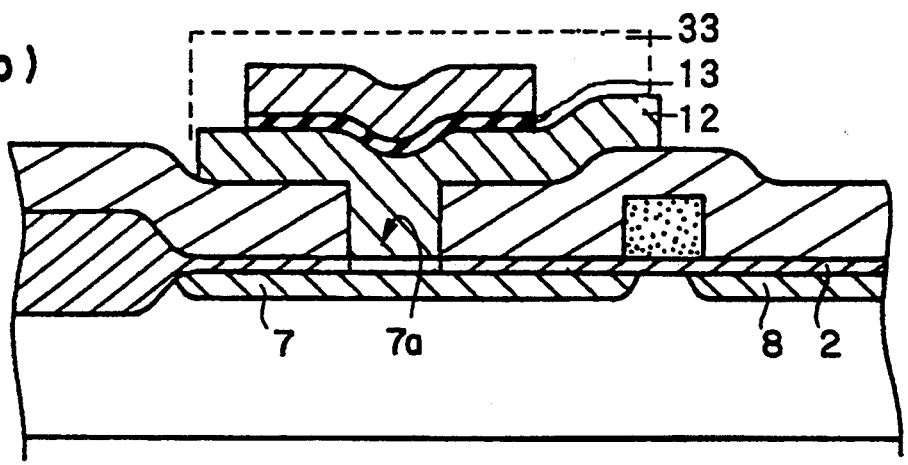
Figure 21C:
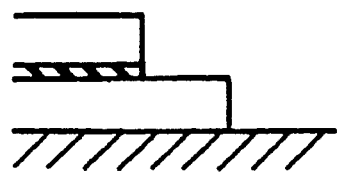

Next, a pattern is formed in the resist as shown by the dotted line in FIG. 21(b), and the edge regions have the structure shown in FIG. 21(c).

Figure 21D:
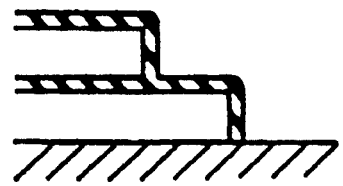

In the present example, by means of conducting a further oxidation, the side surfaces which sustained damage as a result of etching are oxidized, and the edge regions have the structure shown in FIG. 21(d).

EMBODIMENT 6

In the present example, in FIG. 9, in place of the Ti-Al alloy film 12, a film having a 2-layer structure, wherein the lower layer comprises Cr and the upper layer comprises Ti-Al alloy, is formed. It should of course be understood that a multilayered structure of 3 layers or more is also acceptable. In the case of a multilayered structure, it is preferable that the bottommost layer comprise a Cr layer, as in the case of the present preferred embodiment. The adhesion of Cr to $SiO_2$ is good, so that this is preferable.

EMBODIMENT 7

In the present embodiment, the upper electrode comprises Ti, and the subsequent processes are conducted at a temperature of 500° C. or below.

EMBODIMENT 8

In the present embodiment, the oxidation of the surface of the Ti-Al alloy film comprising lower electrode 12 is conducted in the following manner.

Highly pure oxygen gas is supplied to the film deposition chamber, and the surface of the Ti-Al alloy film is irradiated with Ar ions having a kinetic energy of 30 eV. By means of such a method, the DRAM which is produced exhibits a high breakdown voltage, and possesses a large capacitance.

In accordance with the present invention, it is possible to provide an DRAM memory cell which has a high breakdown voltage and possesses a large capacitance.

Modifications of the invention herein disclosed will occur to a person skilled in the art and all such modifications are deemed to be within the scope of this invention as defined by the appended claims.

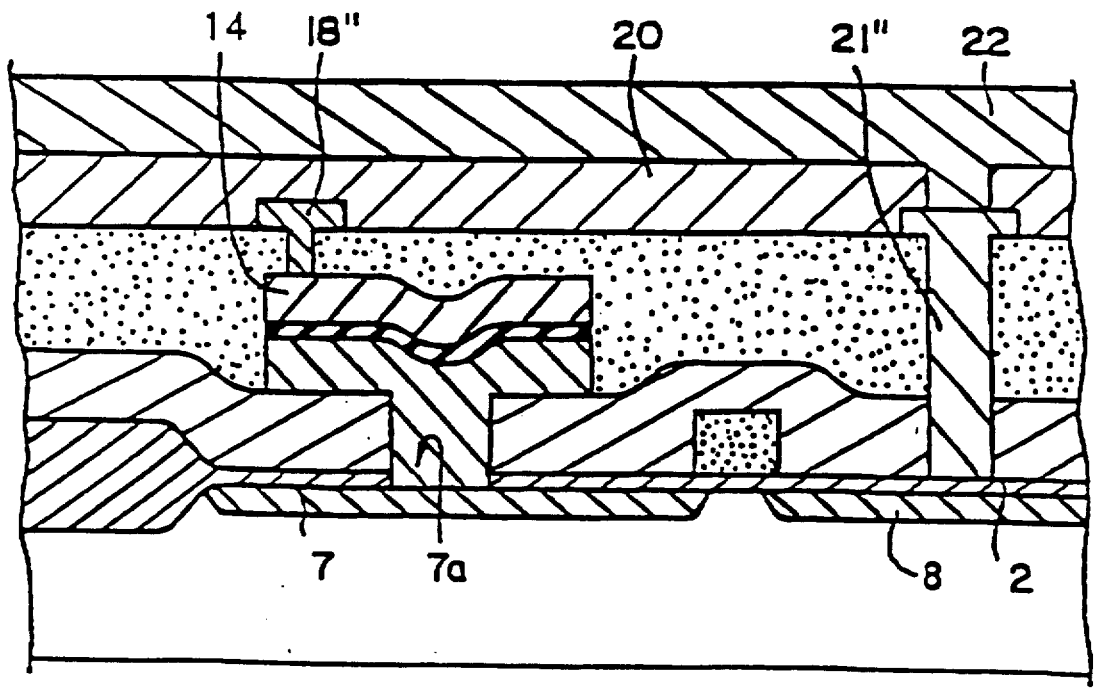

I claim:

1. A dynamic semiconductor memory having at least one capacitor for accumulating signal charges, said at least one capacitor comprising:
    a first electrode which is formed with a thin film of an alloy comprising at least 2 types of metallic elements,
    a mixed insulating thin film comprising an oxide of each of said at least 2 types of metallic elements formed on said first electrode,
    a second electrode formed of a metal on said mixed insulating thin film.

2. A dynamic semiconductor memory in accordance with claim 1, wherein said mixed insulating thin film comprises a thin film formed by means of direct oxidation of a surface of said alloy thin film.

3. A dynamic semiconductor memory in accordance with claim 2, wherein said direct oxidation is conducted by means of supplying oxygen gas to a surface of said alloy thin film, and by irradiating said surface with inert gas ions having a kinetic energy of 90 eV or less.

* * * * *

UNITED STATES PATENT AND TRADEMARK OFFICE
CERTIFICATE OF CORRECTION

PATENT NO. : 5,432,732

DATED : July 11, 1995

INVENTOR(S) : Tadahiro Ohmi

It is certified that error appears in the above-identified patent and that said Letters Patent is hereby corrected as shown below:

Title page should be deleted and replaced with the attached title page, showing the illustrated figure.

In the Drawings:

Figs. 8,9,10,11,12,13,14,15,16,17,18,20(a)-20(b),21(a)-21(b) should be deleted and replaced with the following Figs. 8,9,10,11,12,13,14,15,15,17,18,20(a)-20(b),21(a)-21(b).

Signed and Sealed this

Twelfth Day of December, 1995

Attest:

BRUCE LEHMAN

*Attesting Officer*  *Commissioner of Patents and Trademarks*

United States Patent [19]

Ohmi

[11] Patent Number: 5,432,732
[45] Date of Patent: Jul. 11, 1995

[54] DYNAMIC SEMICONDUCTOR MEMORY
[76] Inventor: Tadahiro Ohmi, 1-17-301. Komegabukuro. 2-chome. Aoba-ku. Sendai-shi. Miyagi-ken. Japan
[21] Appl. No.: 81,375
[22] PCT Filed: Dec. 27, 1991
[86] PCT No.: PCT/JP91/01798
§ 371 Date: Jul. 1, 1993
§ 102(e) Date: Oct. 13, 1993
[87] PCT Pub. No.: WO92/12538
PCT Pub. Date: Jul. 23, 1992
[30] Foreign Application Priority Data
Jan. 1, 1991 [JP] Japan .................. 3-010007
[51] Int. Cl.⁶ .............. H01L 27/10; G11C 11/34
[52] U.S. Cl. .................. 365/149; 437/43; 437/47; 437/52; 257/301; 257/304; 257/310; 257/311; 257/296
[58] Field of Search .......... 437/43, 47, 52, 60, 437/190, 191, 192, 193, 223, 228; 365/149; 257/301, 304, 310, 311, 296

[56] References Cited
U.S. PATENT DOCUMENTS
5,057,447 10/1991 Paterson .................. 437/43

Primary Examiner—Viet Q. Nguyen
Attorney, Agent, or Firm—Young & Thompson

[57] ABSTRACT

A DRAM memory cell which can be easily manufactured, and has a high breakdown voltage, and a large capacitance. The dynamic semiconductor memory has capacitors for accumulating signal charges, each capacitor comprising three layers: a first electrode which is formed with a thin film of an alloy made of two or more kinds of metallic elements, an insulation thin film made of the oxide of the alloy, and a second electrode formed with a metal.

3 Claims, 18 Drawing Sheets